United States Patent
Tanida

(10) Patent No.: US 7,690,905 B2
(45) Date of Patent: Apr. 6, 2010

(54) APPARATUS FOR MANUFACTURING SEMICONDUCTOR DEVICE

(75) Inventor: Katsunori Tanida, Kariya (JP)

(73) Assignee: DENSO CORPORATION, Kariya (JP)

( * ) Notice: Subject to any disclaimer, the term of this patent is extended or adjusted under 35 U.S.C. 154(b) by 223 days.

(21) Appl. No.: 11/826,068

(22) Filed: Jul. 12, 2007

(65) Prior Publication Data
US 2008/0038873 A1    Feb. 14, 2008

(30) Foreign Application Priority Data

Aug. 10, 2006 (JP) ............... 2006-218432
Feb. 27, 2007 (JP) ............... 2007-047645

(51) Int. Cl.
*H01L 21/56* (2006.01)
*B29C 45/14* (2006.01)

(52) U.S. Cl. ............ 425/89; 425/116; 425/125; 425/149

(58) Field of Classification Search ........... 425/89, 425/116, 125, 149
See application file for complete search history.

(56) References Cited

U.S. PATENT DOCUMENTS

| | | | |
|---|---|---|---|
| 4,663,833 A * | 5/1987 | Tanaka et al. | 438/65 |
| 5,438,216 A * | 8/1995 | Juskey et al. | 257/434 |
| 5,622,873 A | 4/1997 | Kim et al. | |
| 5,644,169 A | 7/1997 | Chun | |
| 5,897,338 A * | 4/1999 | Kaldenberg | 438/116 |
| 6,187,243 B1 * | 2/2001 | Miyajima | 264/272.15 |
| 6,300,169 B1 * | 10/2001 | Weiblen et al. | 438/127 |
| 6,489,178 B2 * | 12/2002 | Coyle et al. | 438/51 |
| 6,577,000 B2 * | 6/2003 | Sato et al. | 257/730 |
| 6,700,190 B2 * | 3/2004 | Siegel et al. | 257/684 |
| 2002/0093120 A1 | 7/2002 | Magni et al. | |
| 2002/0164391 A1 | 11/2002 | Shinma | |
| 2005/0196908 A1 | 9/2005 | Takahashi | |

FOREIGN PATENT DOCUMENTS

JP    A-2000-299334    10/2000

OTHER PUBLICATIONS

Office Action dated Feb. 16, 2009 in corresponding German patent application No. 10 2007 034 247.2-33 (and English translation).

* cited by examiner

*Primary Examiner*—Robert B Davis
(74) *Attorney, Agent, or Firm*—Posz Law Group, PLC

(57) ABSTRACT

An apparatus for manufacturing a semiconductor device is provided. The semiconductor device includes a chip packaged with a resin mold. The apparatus includes a first mold, a second mold, and a buffer sheet. The first mold has a first cavity for forming the resin mold on a first side of the semiconductor device, and a convex part for forming an exposed area of the chip. The second mold has a second cavity for forming the resin mold on a second side of the semiconductor device. The buffer sheet is disposed between the convex part and the chip for covering the exposed area.

11 Claims, 17 Drawing Sheets

APPARATUS FOR MANUFACTURING SEMICONDUCTOR DEVICE

CROSS REFERENCE TO RELATED APPLICATIONS

This application is based on Japanese Patent Applications No. 2006-218432 filed on Aug. 10, 2006, and No. 2007-47645 filed on Feb. 27, 2007, the contents of which are incorporated herein by reference in its entirety.

BACKGROUND OF THE INVENTION

1. Field of the Invention

The present invention relates to an apparatus and a method for manufacturing a semiconductor device.

2. Description of the Related Art

Conventionally, a technique for packaging a semiconductor chip on a die pad of a lead frame by resin molding so as to expose the chip to an outside is developed. For example, U.S. Pat. No. 5,622,873 (corresponding to JP Patent No. 3,630,447) discloses a process for manufacturing a solid type image pick-up device. In the process, an image pick-up chip (a semiconductor chip), which is wire-bonded to leads of the lead frame, is packaged by resin molding by using an upper mold having a stepped projection of a size corresponding to a light-receiving region. Thus, a resin mold has a cavity through which the light-receiving part of the image pick-up chip is exposed to the outside.

The above-described manufacturing process can improve productivity compared with a manufacturing process, in which the image pick-up chip is attached to a cavity in a chip-receiving vessel formed by sintering, before the image pick-up chip is wire-bonded to a chip pad. In addition, U.S. Pat. No. 5,622,873 discloses that when the upper mold has a groove at a bottom of the stepped projection, the stepped projection is separated from the light-receiving region of the image pick-up chip. Therefore, the light-receiving region of the image pick-up chip can be prevented from contamination during a process of the resin molding.

However, in a typical image pick-up device, a distance between the light-receiving region and an adjacent pad for wire bonding is set to be about 0.1 to 1 mm. Therefore, at the bottom of the stepped projection, it is difficult to form the groove at a portion corresponding to the light-receiving region by using a mold with a normal accuracy required for a typical resin molding, while arranging a concave part surrounding the groove (i.e., the most projected portion of the stepped projection 20a which is located at both sides of the groove 20'a in FIG. 7 in U.S. Pat. No. 5,622,873) within an area separated from the pad for wire bonding, i.e., within the above-described distance.

Thus, in the manufacturing process disclosed in U.S. Pat. No. 5,622,873, the upper mold having the stepped projection is required to be formed with a high accuracy. However, a cost of the upper mold is generally increased with accuracy, and a production cost of the image pick-up device is increased with an equipment cost. Further, a life of a microfabricated mold tends to be short compared with a mold for the typical resin molding. As a result, an equipment cost and a production cost may increase.

Additionally, in order to position the most projected portion of the stepped projection 20a within the area smaller than 1 mm, the stepped projection is required to be positioned within an accuracy of 10 μm with respect to the image pick-up chip bonded to the lead frame. Thus, the lead frame is required to be positioned with a high accuracy in a horizontal direction, and a carrying system of the lead frame is required to be changed to meet the high accuracy. Therefore, the equipment cost and the production cost may further increase.

As described above, in the manufacturing process disclosed in U.S. Pat. No. 5,622,873, various problems are caused by increasing the accuracy of the mold. It is difficult to prevent the light-receiving region from contamination, i.e., to improve a reliability of the image pick-up device, without increasing the accuracies of the mold and the carrying system. Thus, a yield rate and a mass productivity may be reduced.

SUMMARY OF THE INVENTION

In view of the foregoing problems, it is an object of the present invention to provide an apparatus and a method for manufacturing a semiconductor device for improving a reliability and a mass productivity of a semiconductor chip packaged by resin molding without increasing accuracies required for a mold and a positioning of a lead frame.

According to an aspect of the invention, an apparatus for manufacturing a semiconductor device is provided. The semiconductor device includes a semiconductor chip, a lead frame and a resin mold. The semiconductor chip is disposed on a die pad of the lead frame. The semiconductor chip together with the lead frame is packaged with the resin mold in such a manner that an exposed area of the semiconductor chip is exposed to an outside of the resin mold. The apparatus includes a first mold, a second mold, and a buffer sheet. The first mold has a first cavity for providing a shape of the resin mold on a first side of the semiconductor device, and a convex part for forming the exposed area of the semiconductor chip. The second mold has a second cavity for providing a shape of the resin mold on a second side of the semiconductor device. The buffer sheet is disposed between the convex part and the semiconductor chip for covering the exposed area of the semiconductor chip in order to prevent a resin material of the resin mold from adhering to the exposed area.

The buffer sheet prevents the convex part from directly contacting and contaminating to the exposed area of the semiconductor chip. Therefore, the reliability and the mass productivity of the semiconductor chip packaged by resin molding are improved without increasing the accuracies required for the mold and the positioning of the lead frame.

According to another aspect of the invention, a method for manufacturing a semiconductor device is provided. The semiconductor device includes a semiconductor chip, a lead frame and a resin mold. The semiconductor chip is disposed on a die pad of the lead frame. The semiconductor chip together with the lead frame is packaged with the resin mold in such a manner that an exposed area of the semiconductor chip is exposed to an outside of the resin mold. The method includes a step of setting a first mold on the semiconductor chip, in which the first mold has a first cavity for providing a shape of the resin mold on a first side of the semiconductor device and a convex part for forming the exposed area of the semiconductor chip, a step of arranging a buffer sheet between the convex part and the semiconductor chip for covering the exposed area of the semiconductor chip, and a step of filling a resin material into the first cavity.

The buffer sheet prevents the convex part from directly contacting and contaminating to the exposed area of the semiconductor chip. Therefore, the reliability and the mass productivity of the semiconductor chip packaged by resin molding are improved without increasing the accuracies required for the mold and the positioning of the lead frame.

BRIEF DESCRIPTION OF THE DRAWINGS

Additional objects and advantages of the present invention will be more readily apparent from the following detailed description of preferred embodiment when taken together with the accompanying drawings. In the drawings.

DETAILED DESCRIPTION OF THE PREFERRED EMBODIMENTS

An apparatus and a method for manufacturing a semiconductor device according to an embodiment of the invention can be applied to a molding apparatus 20 which packages a semiconductor chip Sc such as a solid-state image sensor by resin molding.

The solid-state image sensor is a photoelectric conversion element which is formed into an integrated circuit by using a manufacturing technique of a semiconductor element. The solid-state image sensor packaged by resin molding is used as an image sensor Dv, e.g., a CCD image sensor and a CMOS image sensor. Thus, the semiconductor chip Sc is packaged so that a light-receiving part Pt is exposed to an outside for receiving a light from the outside.

Figure 1:
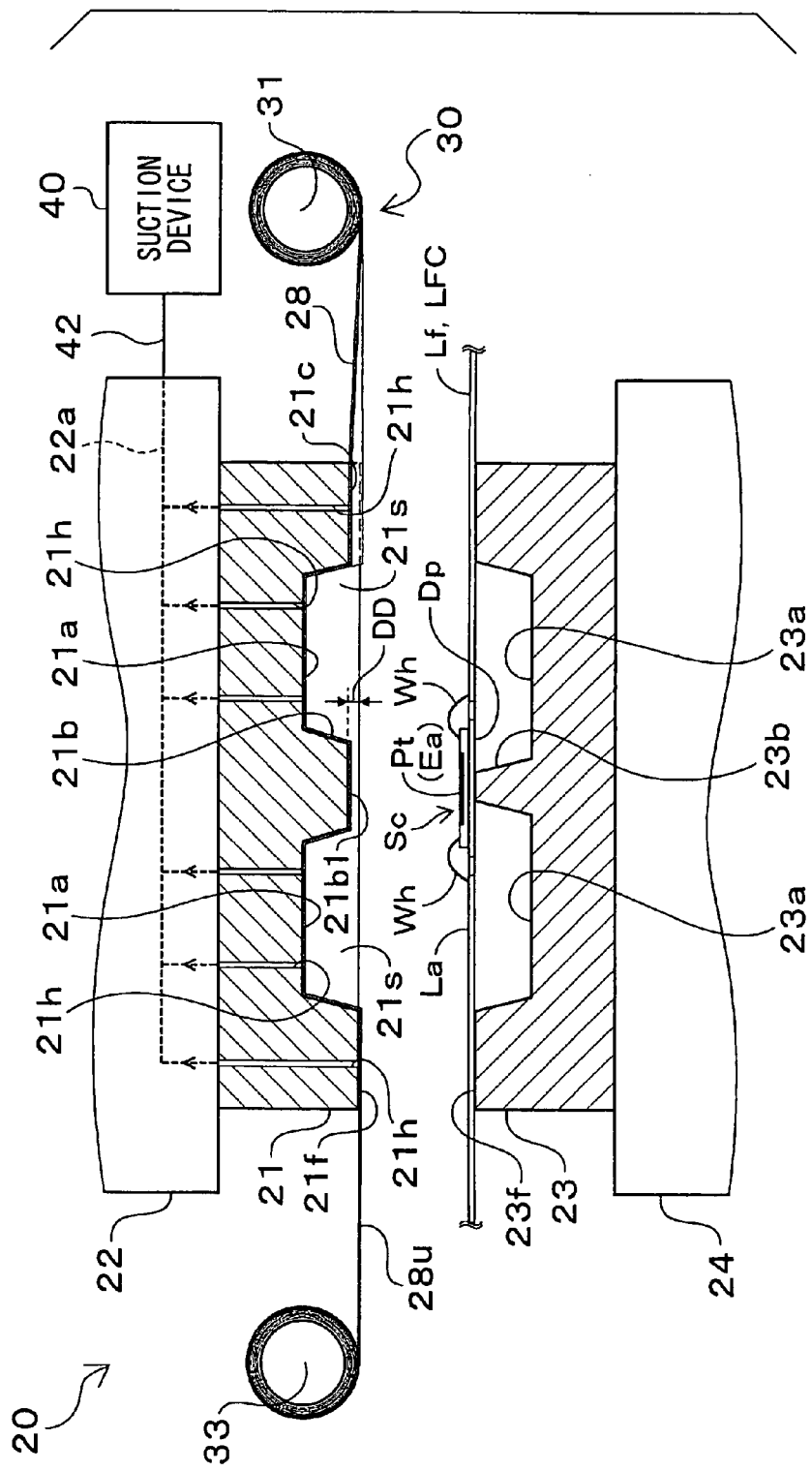
FIG. 1 is a cross-sectional view showing a molding apparatus according to an embodiment of the invention.

As shown in FIG. 1, the molding apparatus 20 is a semiconductor manufacturing apparatus for packaging the semiconductor chip Sc disposed on a die pad Dp of a lead frame Lf by resin molding, and includes an upper mold 21, a pressure device 22, a lower mold 23, a base 24, a buffer sheet 28, carrying device 28, and a suction device 40. The semiconductor chip Sc is die-bonded to the die pad Dp, and leads La of the lead frame Lf are connected to wires Wh which are wire-bonded.

The upper mold 21 is a mold for forming a shape of a resin mold on a side of the surface of the semiconductor chip Sc, i.e., on a side of the light-receiving part Pt. The upper mold 21 is moved up/down by the pressure device 22 and a guiding device (not shown).

Figure 9A:
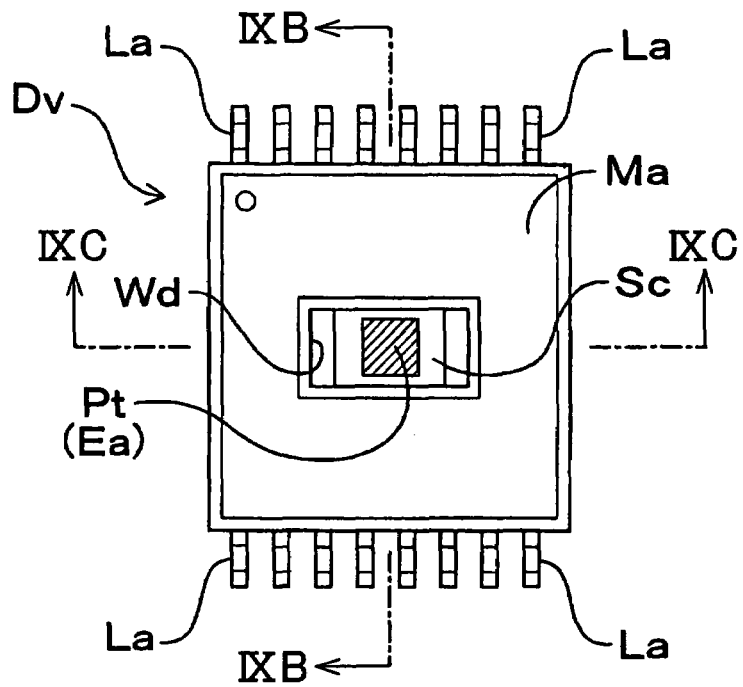
FIG. 9A is a plan view of the image sensor.
Figure 9B:
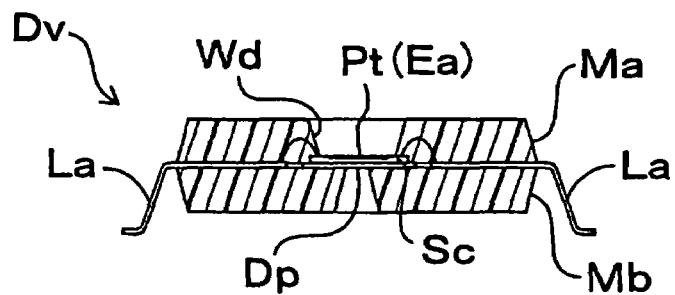
FIGS. 9B and 9C are cross-sectional views of the image sensor taken along line IXB-IXB or IXC-IXC in FIG. 9A.
Figure 9C:
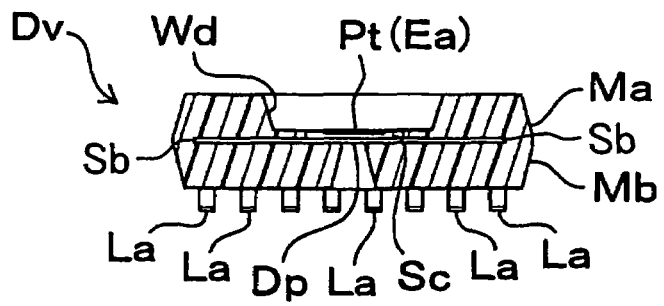

Inside the upper mold 21, an upper cavity 21a is formed into a concave shape so that a resin mold Ma, which is an upper half of a resin mold of an image sensor Dv, for instance in FIGS. 9A-9C, is formed thereby. A convex part 21b, which protrudes into a trapezoidal pillar shape, is formed at an approximately center portion of the upper cavity 21a.

The convex part 21b is used for forming a window part Wd of the image sensor Dv. A shape of a convex surface 21b1, which is a top of the trapezoidal pillar shape, becomes a shape of the window part Wd. The window part Wd is an opening part for exposing the semiconductor chip Sc to the outside. A height of the convex part 21b is set to be lower than a contact surface 21f of the upper mold 21 by a distance DD.

Figure 2A:
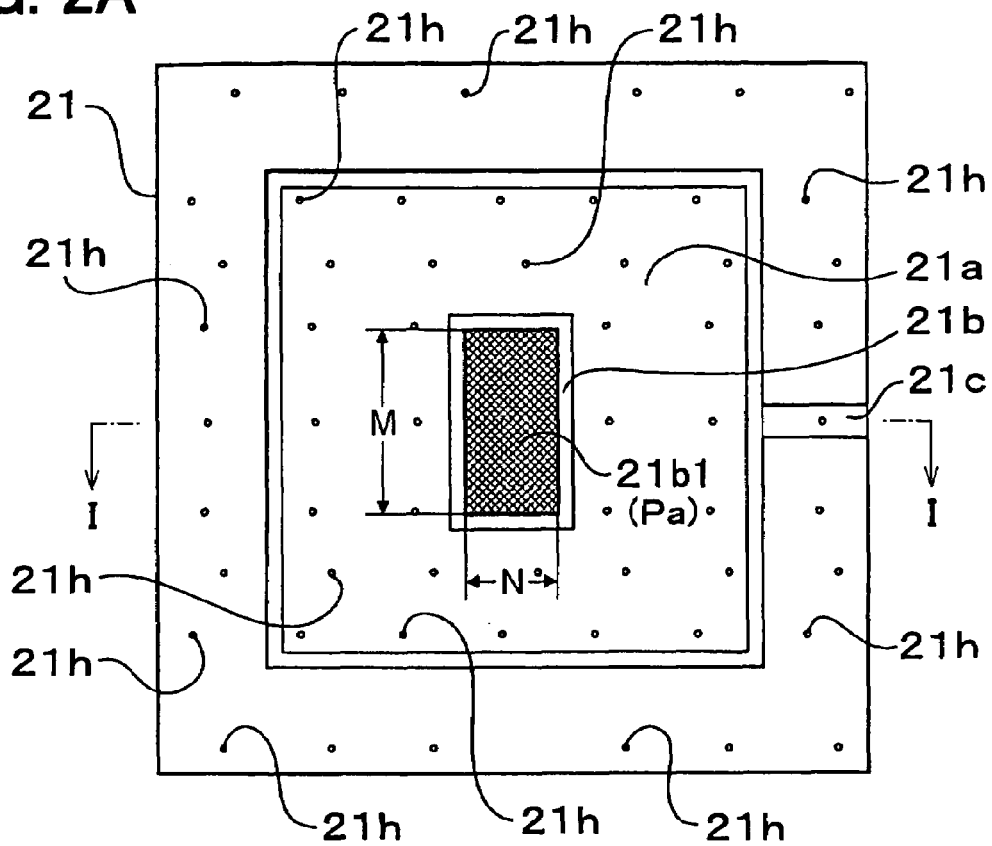
FIGS. 2A and 2B are plan views showing insides of an upper mold and a lower mold of the molding apparatus in FIG. 1.
Figure 2B:
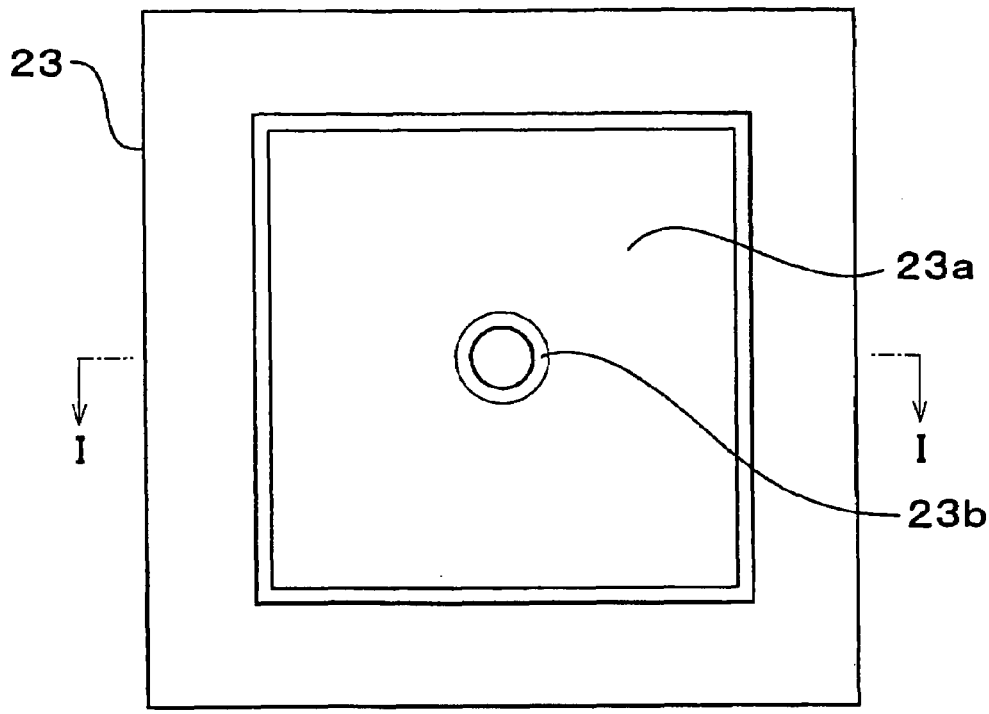

In FIG. 2A, which shows the inside of the upper mold 21, the convex surface 21b1 of the convex part 21b is formed into a rectangular shape in which a long side is defined as M and a short side is defined as N. Therefore, the window part Wd formed with the convex part 21b becomes the rectangular shape, and an area Pa. pressed by the convex part 21b (hereafter, a pressed area) becomes the rectangular shape. When the buffer sheet 28 is pressed by the convex part 21b toward the semiconductor chip Sc, a wrinkle may be generated. However, when the convex surface 21b1 is the rectangular shape, the wrinkle can be escaped in a longitudinal direction of the convex part 21b. Therefore, when the convex surface 21b1 is the rectangular shape, the wrinkle of the buffer sheet 28 is less generated surrounding the convex part 21b compared with a case where the convex surface 21b1 is a square shape.

As shown in FIG. 1 and FIG. 2A, the upper mold 21 has a plurality of adsorbing holes 21h. The adsorbing holes 21h are communicating holes for communicating with the outside and the inside of the upper mold 21 in a direction of a thick. In the embodiment, the adsorbing holes 21h communicates with an inner space 21s of the upper mold 21 including the convex part 21b and an inner passage (i.e., an air passage 22a) of the pressure device 22.

As shown in FIG. 1, the pressure device 22 is connected to an outside of the upper mold 21, i.e., an opposite side of a side on which the upper cavity 21a is formed. The pressure device 22 includes an oil hydraulic cylinder (not shown) for pressing down and pulling up the upper mold 21. In the embodiment, the air passage 22a is formed in the pressure device 22. The air passage 22a is connected with each of the adsorbing holes 21h and an air pipe 42 of the suction device 40.

The upper mold 21 further includes a runner 21c, through which a resin material (e.g., an epoxy resin) for forming the shape of the resin mold is injected from the outside, and an air hole (not shown) for discharging air in the upper cavity 21a to the outside.

Figure 3A:
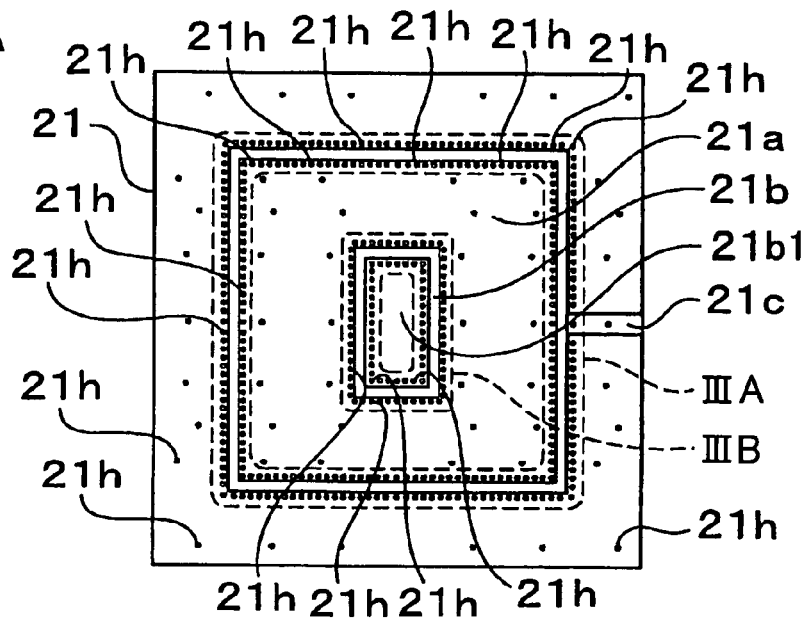
FIGS. 3A-3C are plan views showing upper molds according to modifications of the upper mold in FIG. 2A.
Figure 3B:
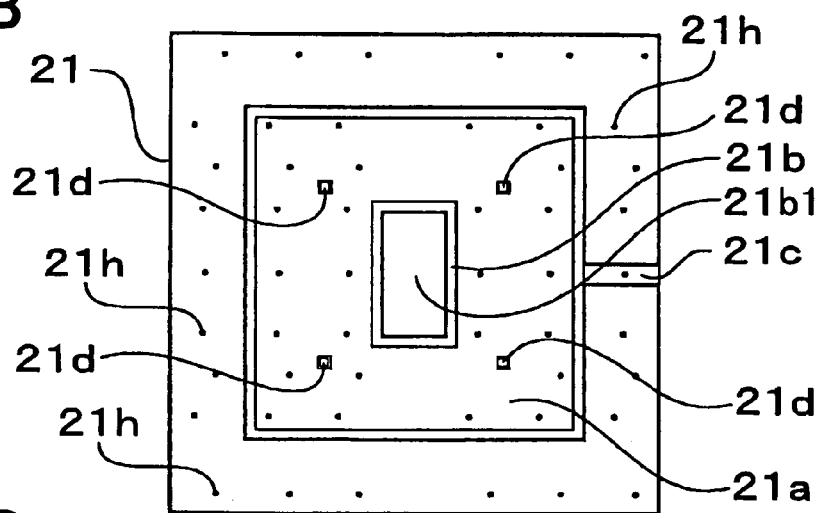
Figure 3C:
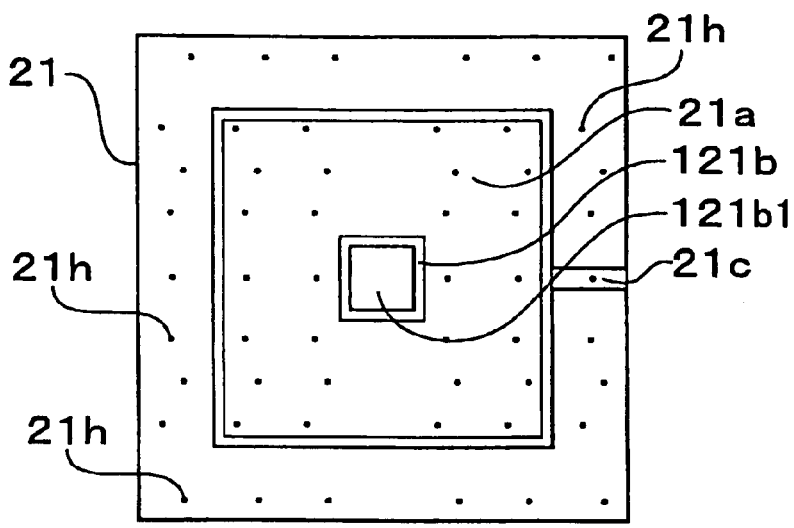

Instead of the upper mold 21 in FIG. 2A, upper molds 21 in FIGS. 3A-3C may be used, for example. As shown in FIG. 3A, the upper mold 21 includes stepped parts IIIA and IIIB, and other parts. The stepped part IIIA is disposed around a boundary between the upper cavity 21a and the contact surface 21f. The stepped part IIIB is disposed around a boundary between the convex part 21b and the upper cavity 21a. The adsorbing holes 21h in the stepped parts IIIA and IIIB may be more than in the other parts. When a number of the adsorbing holes 21h formed in the stepped parts IIIA and IIIB is increased, an adsorbing force in the stepped parts IIIA and IIIB due to a suction by the suction device 40 is increased.

As shown in FIG. 3B, projected parts 21d for forming attaching slots Dh for a holder Hd may be formed in a predetermined part in the upper cavity 21a of the upper mold 21. Herewith, the holder Hd, for instance in FIGS. 10A and 10B, can be attached on an upper surface of an image sensor Dva, and a lens Le held by the holder Hd trough a barrel Br is positioned easily and reliably.

Further, a shape of the convex surface 21b1 of the convex part 21b is not limited to be the rectangular shape as described above. For example, as shown in FIG. 3C, a convex part 121b having a square-shaped convex surface 121b1 may be formed in the upper mold 21 instead of the convex part 21b. Herewith, the window part Wd formed in the resin mold Ma becomes a square shape. Therefore, the semiconductor chip is exposed to the outside by focusing the minimum area.

The lower mold 23 is a mold for forming the resin mold of the image sensor Dv on a backside of the semiconductor chip Sc, i.e., on a side of the die pad Dp. The lower mold 23 is fixed to the base 24, and the base 24 is fixed to a reference surface of the molding apparatus 20.

Inside the lower mold 23, a lower cavity 23a for forming a resin mold Mb, which is a lower half of the image sensor Dv, for instance shown in FIGS. 9A-9C, is formed. A die mount 23b, which is formed into an approximately cone shape, is formed in an approximately center portion of the lower cavity 23a.

The die mount 23b is used for supporting the die pad Dp from a lower side thereof. The semiconductor chip Sc is disposed on the die pad Dp. Therefore, when the semiconductor chip Sc is pressed by the convex part 21b of the upper mold 21, the semiconductor chip Sc is not pressed out on a side of the lower cavity 23. A height of the die mount 23b is set to be even to a contact surface 23f of the lower mold 23. The lower mold 23 also includes an air hole (not shown) for discharging air in the lower cavity 23a to the outside.

The buffer sheet 28 is a film sheet formed into a belt shape made of a synthetic resin such as a Teflon-based synthetic resin (Teflon is a registered trademark). A width and a length of the buffer sheet 28 is set so that when the resin material for forming the resin mold Ma is filled in the convex part 21b of the upper mold 21, the buffer shape 28 covers the whole area of the light-receiving part Pt (exposed area Ea) of the semiconductor chip Sc, by lying between the convex part 21b and the light-receiving part Pt. When the buffer sheet 28 is made of the Teflon-based synthetic resin, the thickness of the buffer sheet 28 is set to be approximately 10 to 100 μm. However, the thickness of the buffer sheet 28 is set based on a material, so that the buffer sheet 28 is not torn by a pressure of the convex part 21b, and easily adsorbs to an inner surface of the upper mold 21.

Figure 4A:
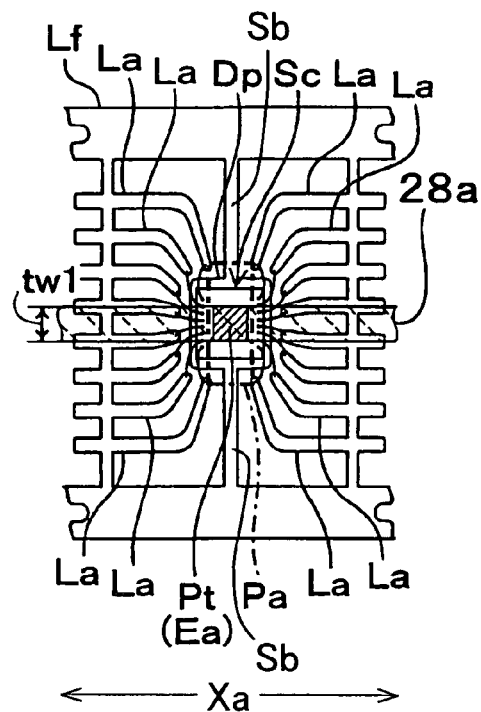
FIGS. 4A-4D are plan views showing lead frames and buffer sheets of various widths.

When the lead frame Lf is carried in a longitudinal direction (Xa) of the lead La of the lead frame Lf, i.e., a direction in which the leads La extends, the buffer sheet 28 is arranged to move in the longitudinal direction (Xa) of the lead La, as shown in FIGS. 4A-4D. The width of the buffer sheet 28, i.e., the width in a direction perpendicular to the longitudinal direction (Xa) of the lead La is set to be a value which is not less than a width tw1. As shown in FIG. 4A, when a buffer sheet 28a with the width of tw1 is used, the buffer sheet 28a covers at least the light-receiving part Pt (exposed area Ea) of the semiconductor chip Sc disposed on the die pad Dp. Therefore, the buffer sheet 28a prevents the convex part 21b of the upper mold 21 from directly contacting the light-receiving part Pt. Further, the buffer sheet 28a is the belt shape, so the buffer sheet 28a covers over the width of the light-receiving part Pt in the longitudinal direction (Xa).

Figure 4B:
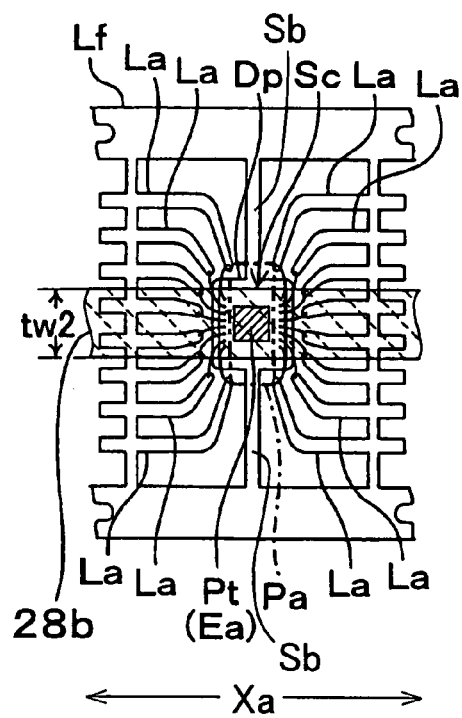

When the width of the buffer sheet 28 can be set to be greater than the width tw1, a buffer sheet 28b with a width of tw2, which covers the whole surface of the semiconductor chip Sc, may be used as shown in FIG. 4B. Herewith, the buffer sheet 28b covers not only the light-receiving part Pt but also the whole semiconductor chip Sc. Because the width of the buffer sheet 28b is set to be the width tw2 which is greater than the width tw1, even if the buffer sheet 28b slides in the direction perpendicular to the longitudinal direction (Xa) of the lead La, the buffer sheet 28b is positioned easily.

Figure 4C:
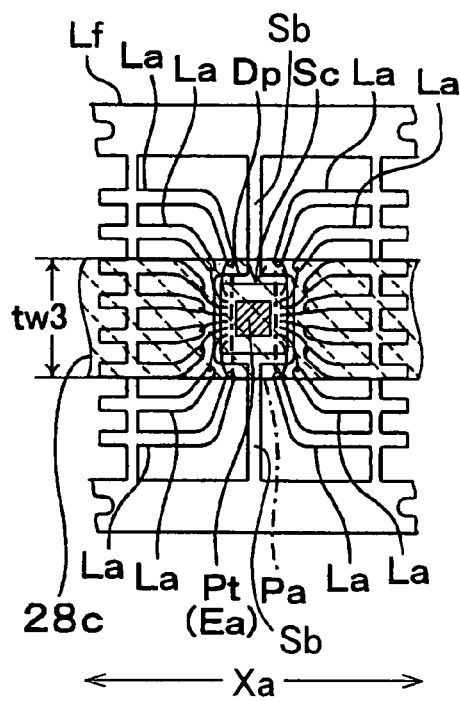

Further, when the width of the buffer sheet 28 can be set to be greater than the width tw2, a buffer sheet 28c with a width of tw3, which covers the whole surface of the die pad Dp and the area Pa pressed by the convex part 21b, may be used as shown in FIG. 4C. Herewith, the buffer sheet 28c prevents the convex part 21b from directly contacting the semiconductor chip Sc. Because the buffer sheet 28c has a dimensional allowance in the direction perpendicular to the longitudinal direction (Xa) of the lead La, the buffer sheet 28c is positioned more easily. When the buffer sheet 28c is positioned in a carrying device 30, a required accuracy in a direction of the width is reduced. Therefore, the setting up of the carrying device 30 becomes easy.

Figure 4D:
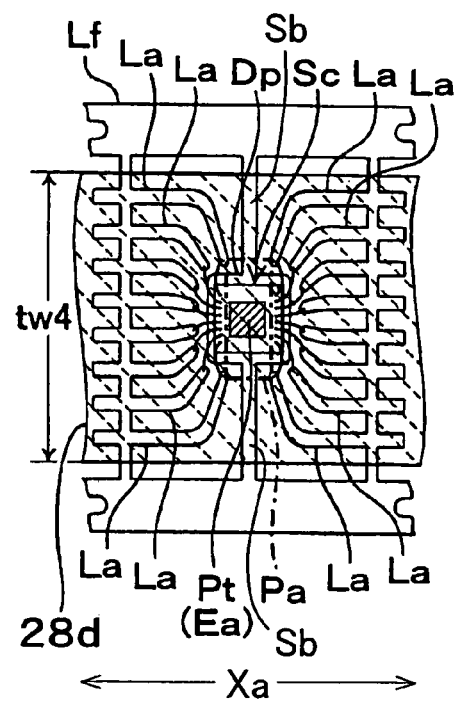

When the width of the buffer sheet 28 can be set to be greater than the width tw3, the buffer sheet 28d with a width of tw4, which covers the whole surface of the lead frame Lf, may be used as shown in FIG. 4D. Because the buffer sheet 28d has a dimensional allowance in the direction perpendicular to the longitudinal direction (Xa) of the lead La, the buffer sheet 28d is positioned more easily. When the buffer sheet 28d is disposed in a carrying device 30, an accurate-positioning is rarely required in the direction of the width. Therefore, the setting up of the carrying device 30 becomes easy.

Figure 5A:
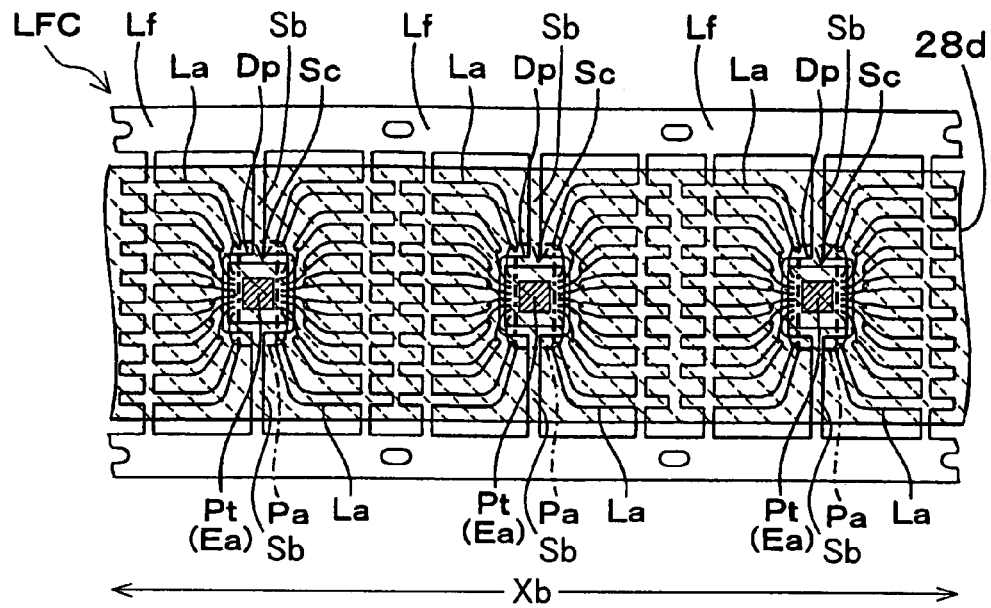
FIGS. 5A and 5B are plan views showing the lead frames and the buffer sheets of various widths.
Figure 5B:
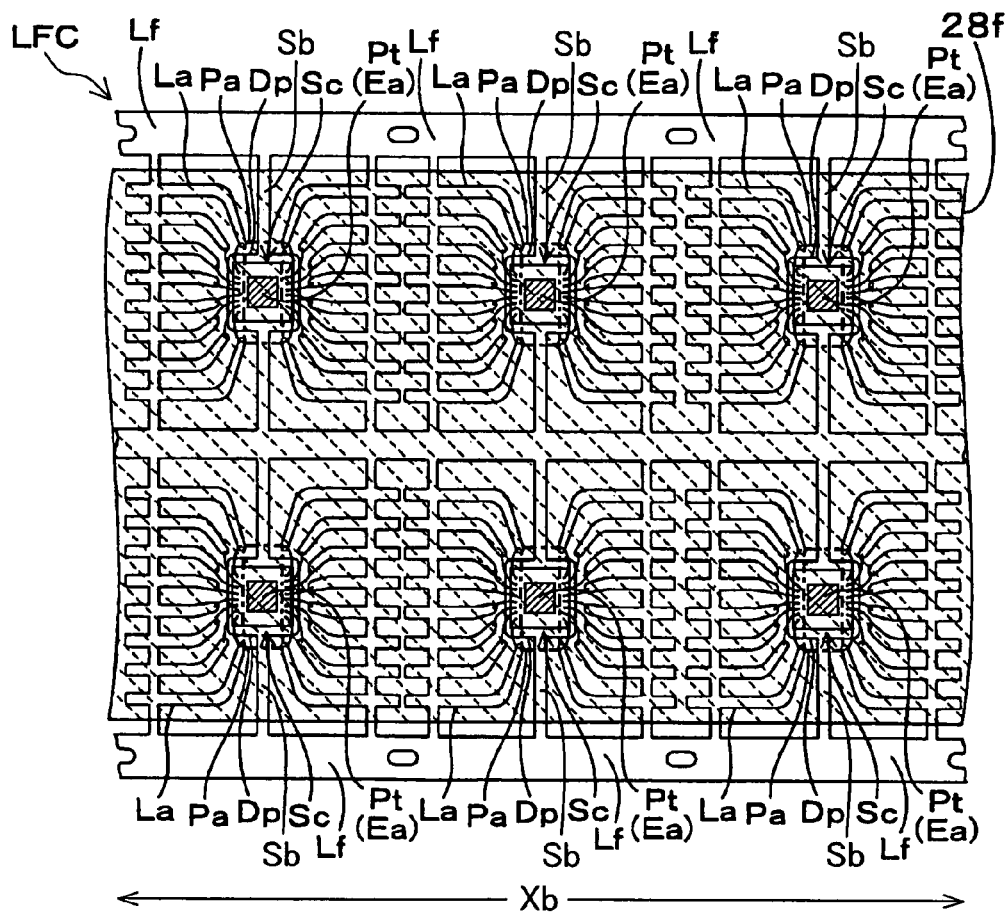

As shown in FIGS. 5A and 5B, typically, a plurality of lead frames Lf are arranged in a line or a plurality of lines, and form a tape-shaped lead frame collectivity LFC. In this case, the belt-shaped buffer sheet 28 is carried along a direction of the line in which the lead frames Lf are arranged (hereafter, linearly-arranged direction (Xb)).

When the lead frames Lf are arranged in a line as shown in FIG. 5A, for instance, the buffer sheet 28d, which covers the whole lead frame Lf, may be used without positioning in the linearly-arranged direction (Xb) and a direction approximately perpendicular to the linearly-arranged direction (Xb). Therefore, the arrangement of the currying device 30 becomes easy compared with a case where the positioning in each or both of the directions is required.

When the lead frames Lf are arranged in two lines as shown in FIG. 5B, for instance, the buffer sheet 28f, which covers two lines of lead frame Lf, may be used without positioning in the linearly-arranged direction (Xb) and the direction approximately perpendicular to the linearly-arranged direction (Xb). Therefore, the arrangement of the currying device 30 becomes easy compared with a case where the positioning in each or both of the directions is required.

In the above-described example, the belt-shaped buffer sheet 28 (28a, 28b, 28c, 28d and 28f) is disposed in the longitudinal direction (Xa) of lead La. However, the buffer sheet 28 may be disposed in the direction (Xc) approximately perpendicular to the longitudinal direction (Xa) of lead La.

For example, the buffer sheet 28a with the width of tw1, which covers at least the light-receiving part Pt, is carried in the direction (Xc) approximately perpendicular to the longitudinal direction (Xa) of lead La. Herewith, the buffer sheet 28a prevents the convex part 21b of the upper mold 21 from directly contacting the light-receiving part Pt.

Alternatively, a buffer sheet 28e with a width of tw5, which is greater than the width tw1 and approximately same width with a short side of the pressured area Pa by the convex part 21b, may be used. The buffer sheet 28e covers not only the light-receiving part Pt but also approximately whole surface of the pressured area Pa without a relation to the length of the long side of the pressured area Pa. Therefore, the buffer sheet 28e is used efficiently.

Figure 6A:
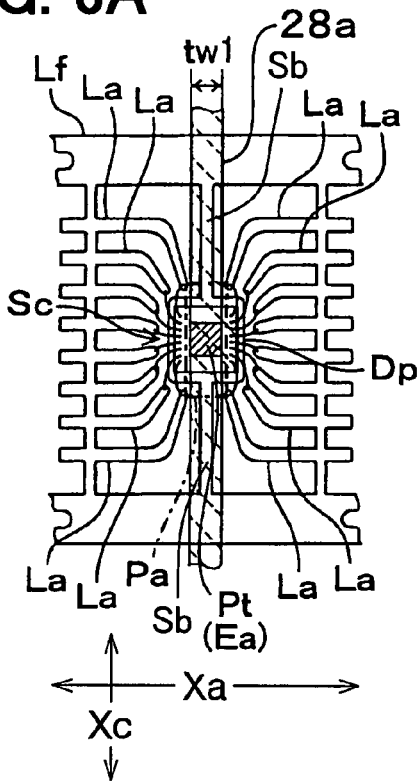
FIGS. 6A-6D are plan views showing the lead frames and the buffer sheets of various widths.
Figure 6B:
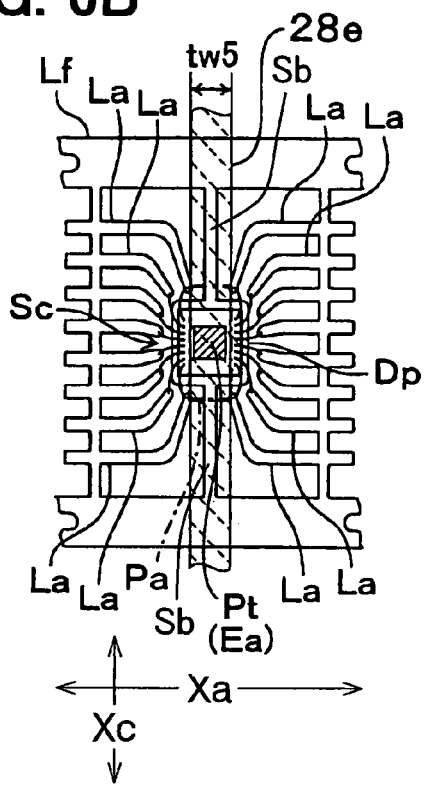
Figure 6C:
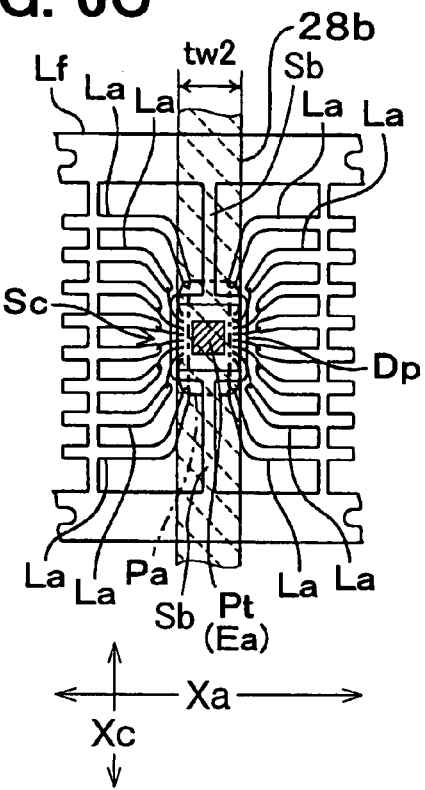

Further, as shown in FIG. 6C, the buffer sheet 28b, which covers the whole surface of the semiconductor chip Sc, may be used. Because the width of the buffer sheet 28b is set to be the width tw2 which is greater than the width tw1, even if the buffer sheet 28b slides in the longitudinal direction (Xa) of the lead La, the buffer sheet 28b is positioned easily.

Figure 6D:
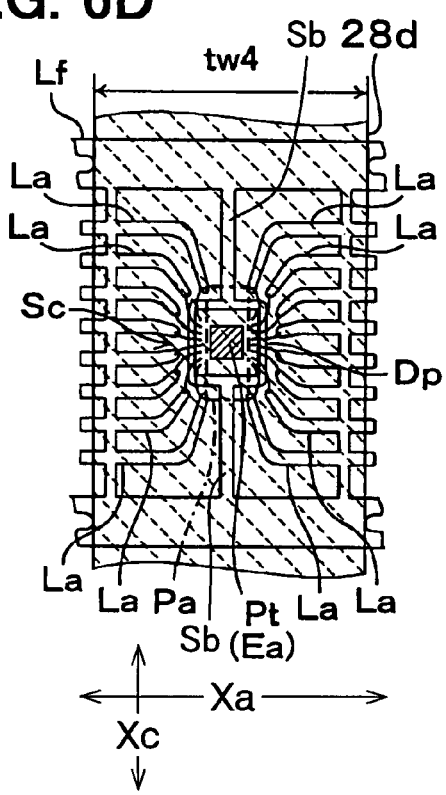

Alternatively, as shown in FIG. 6D, the buffer sheet 28d, which covers the whole surface of the lead frame Lf in the direction (Xc) approximately perpendicular to the longitudinal direction (Xa) of the lead La, may be used. Because the buffer sheet 28d with the width of tw4 has the dimensional allowance in the longitudinal direction (Xa) of the lead La, the buffer sheet 28d covers the light-receiving part Pt without positioning accurately, i.e., with positioning roughly.

When the buffer sheet 28 is carried in the direction (Xc) approximately perpendicular to the longitudinal direction (Xa) of the lead La, the buffer sheet 28 is positioned in the direction (Xc) approximately perpendicular to the direction in which the lead frame Lf is carried. Therefore, the lead frame Lf is positioned with respect to the carrying device of the lead frame Lf. In other words, the resin material is required to be filled in the upper cavity 21a of the upper mold 21 and the lower cavity 23a of the lower mold 23, when the lead frame Lf is positioned below the buffer sheet 28.

Next, the carrying device 30 and the suction device 40 will be described with reference to FIG. 1. The carrying device 30 includes a delivering unit 31 and a rewinding unit 33. The carrying device 30 is used for carrying the buffer sheet 28. In the embodiment, the delivering unit 31 delivers the winding buffer sheet 28 to the semiconductor chip Sc on the lead frame Lf located between the upper mold 21 and the lower mold 23, and rewinding unit 33 rewinds a used buffer sheet 28u which has passed on the semiconductor chip Sc.

The delivering unit 31 and the rewinding unit 33 are controlled coincidently with a vertical movement of the upper mold 21 so that the used buffer sheet 28u, which is generated by finishing the resin molding with the upper mold 21 and the lower mold 23, is changed with the buffer sheet 28 before use. Therefore, the buffer sheet 28 is delivered automatically.

As described above, the buffer sheet 28 is required to be positioned with respect to the light-receiving part Pt of the semiconductor chip Sc in the direction of the width of the buffer sheet 28. Therefore, the delivering unit 31 and the rewinding unit 33 are formed so that the buffer sheet 28 is positioned by setting up the carrying device 30.

The suction device 40 is a suction pump for sucking gas such as air, and is communication with the air passage 22a of the pressure device 22 through the air pipe 42 connected with the suction holes (not shown). When the suction device 40 is operated, the suction device 40 sucks an object in the inner space 21s of the upper mold 21 through the pressure device 22 and air passage 22a. Therefore, when the buffer sheet 28 is disposed in the inner surface 21s, the buffer sheet 28 is adsorbed to the inner wall of the upper mold 21. The suction device 40 is formed not only for sucking but also for discharging a pressured air from the suction holes.

Figure 7A:
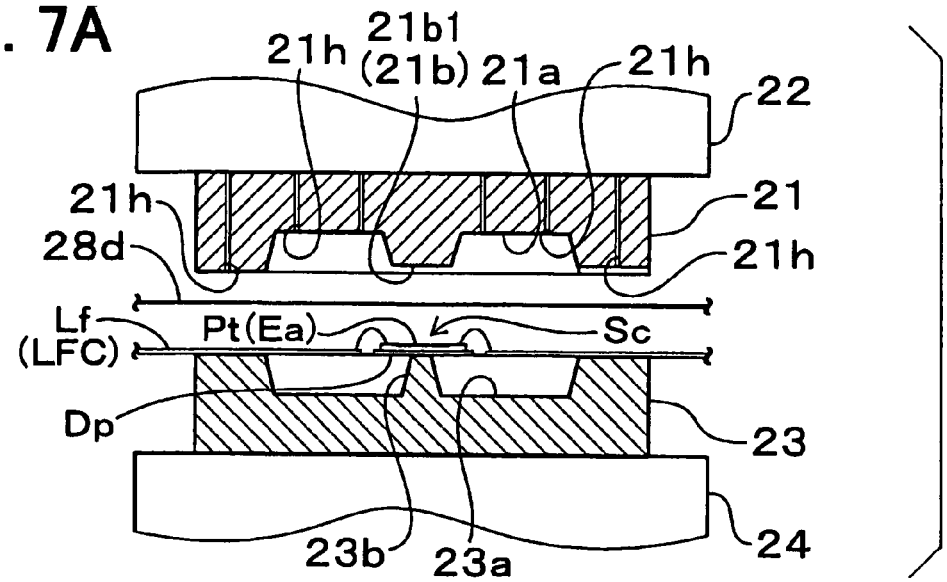
FIGS. 7A-7C are cross sectional views showing a process of manufacturing an image sensor.
Figure 7B:
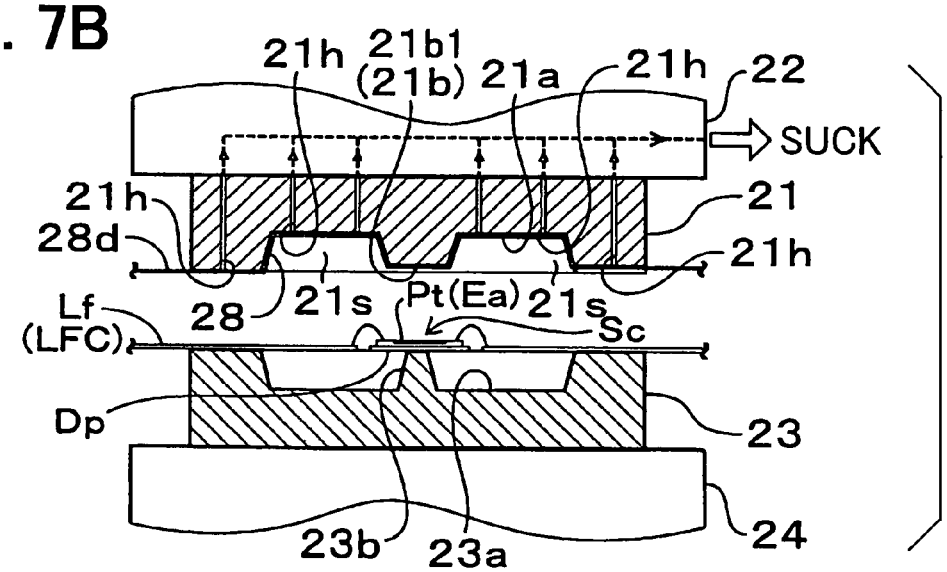
Figure 7C:
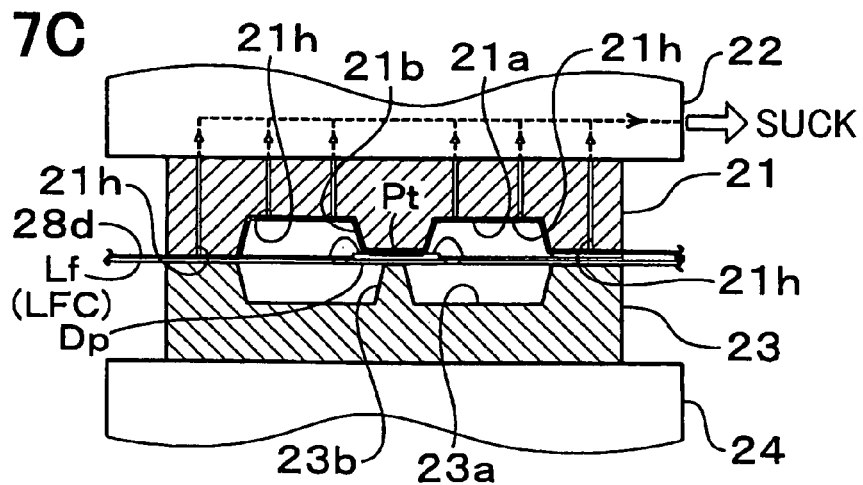
Figure 8A:
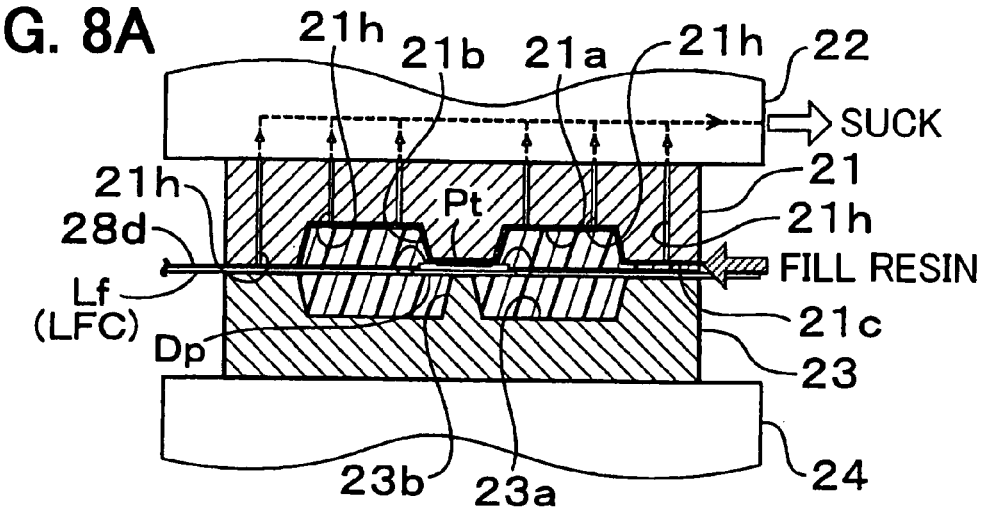
FIGS. 8A-8D are cross sectional views showing the process of manufacturing the image sensor.
Figure 8B:
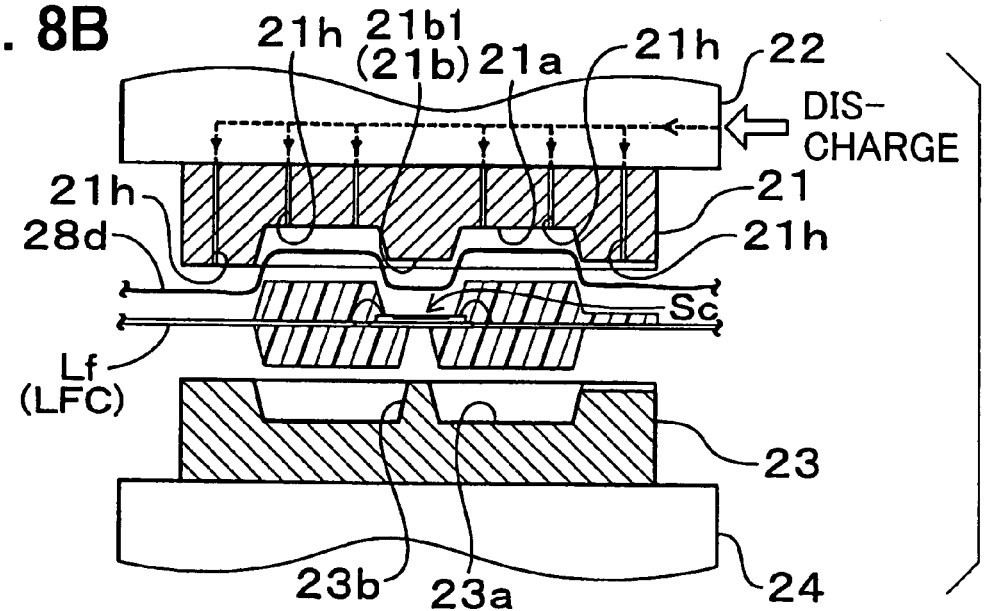
Figure 8C:
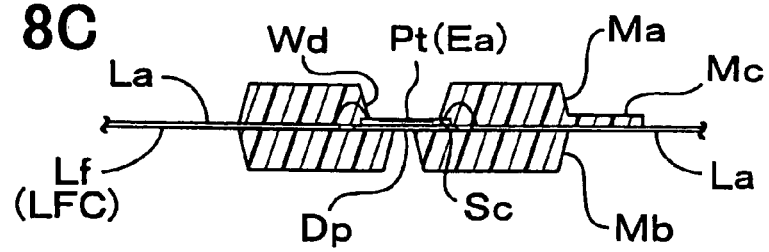
Figure 8D:
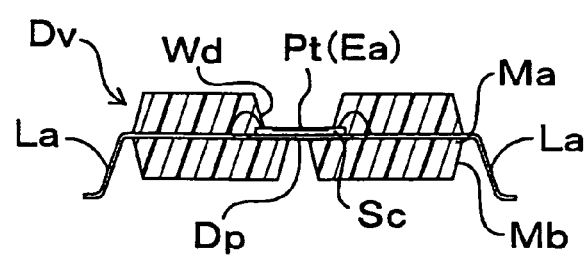

The semiconductor chip Sc which is die-bonded to the lead frame Lf is set to the mold equipment 20, and is packaged with the resin material by processes, for instance in FIGS. 7A-7C and 8A-8C, for forming the image sensor Dv in FIG. 8D. Following the above-described setting up process, in which the lead frame Lf and the buffer sheet 28 are set in a predetermined position and a predetermined direction as shown in FIGS. 4A-6D, a lead frame setting process is performed.

As shown in FIG. 7A, in the lead frame setting process, the lead frame Lf having the semiconductor chip Sc bonded to the die pad Dp is set on the die mount 23 of the lower mold 23. Then, the buffer sheet 28 is disposed between the semiconductor chip Sc of the lead frame Lf and the convex part 21b of the upper mold 21. The width and position of the buffer sheet 28 is as described above. In this case, the semiconductor chips Sc are disposed on the lead frame collectivity LFC in which the plurality of lead frames Lf are arranged in a line as shown in FIG. 5A. Therefore, the buffer sheet 28d with the width of tw4, which covers the whole surface of the lead frame Lf, is used.

After the lead frame setting process in FIG. 7A, a buffer sheet adsorbing process in FIG. 7B is performed. In the embodiment, the buffer sheet 28d disposed between the semiconductor chip Sc and the convex part 21b of the upper mold 21 is adsorbed to the inner wall of the upper mold 21 by operating the suction device 40 through the adsorbing holes 21h of the upper mold 21. Therefore, the buffer sheet 28d between the convex part 21b and the semiconductor chip Sc is exactly adsorbed to the convex part 21b and the upper cavity 21a of the upper mold 21.

After the buffer sheet adsorbing process in FIG. 7B, a pressing process in FIG. 7C is performed. The lead frame collectivity LFC disposed between the upper mold 21 and the lower mold 23 is pressed by the both molds 21 and 23. The both molds 21 and 23 form the upper cavity 21a and the lower cavity 23a in which the resin material is injected. The buffer sheet 28d is disposed between the upper mold 21 and the lower mold 23 as well as between the convex part 21b and the light-receiving part Pt of the semiconductor chip Sc.

In the center portion of the both molds 21 and 23, the semiconductor chip Sc on the die pad Dp is pressed by the convex part 21b of the upper mold 21 and the die mount 23b of the lower mold. The buffer sheet 28 disposed between the convex part 21b and the light-receiving part Pt of the semiconductor chip Sc prevents the convex part 21b from directly contacting and contaminating to the light-receiving part Pt.

The convex part 21b functions as a mold holder by pressing. Thus, when the upper cavity 21b is filled with the resin material in a resin injecting process, a portion in which the convex part 21b is occupied is prevented from filling with the resin material. As a result, the window part Wd is firmed on the light-receiving part Pt of the semiconductor chip Sc.

A pressure by the upper mold 21 is set so that the resin material filling into the upper cavity 21a and the lower cavity 23a is prevented from leaking out of the both molds 21 and 23, and that the light-receiving part Pt pressed by the convex part 21b is prevented from being damaged by the pressure.

In the resin material injecting process in FIG. 8A, the resin material is injected into the upper cavity 21a and the lower cavity 23a through the runner 21c of the upper mold 21. Because the air in the upper cavity 21a and the lower cavity 23a is discharged form the air holes (not shown) formed in the upper mold 21 and the lower mold 23, the resin material is injected easily.

After the resin material injecting process in FIG. 8A, a mold stripping process in FIG. 8B is performed. The semiconductor chip Sc and the lead frame Lf, which are packaged by the harden resin mold, is removed from the upper mold 21 and the lower mold 23.

At this time, the suction device 40 which has been sucking in the upper cavity 21a is stopped or changed to discharge. Thus, an adsorptivity which adsorbs the buffer sheet 28d to the inner wall of the upper mold 21 through the adsorbing holes 21h is reduced rapidly. Further, a discharging force working to a direction, in which the buffer sheet 28d is taken from the inner wall of the upper mold 21, is generated by air pressure discharged from the adsorbing holes 21h. Therefore, the buffer sheet 28d and the resin mold Ma is easily removed from the upper mold 21.

The buffer sheet 28d removed with the resin mold Ma from the upper mold 21 becomes the used buffer sheet 28u. Thus, the new buffer sheet 28 before use, for changing with the used buffer sheet 28u, is carried by the carrying device 30, and is prepared for the lead frame setting process, in which the semiconductor chip Sc of the next lead frame Lf is packaged by resin molding.

The resin molds Ma and Mb removed from the upper mold 21 and the lower mold 23 are connected to the lead frame through a diver as shown in FIG. 8C. Therefore, in a diver cutting process, an unnecessary resin mold portion Mc formed by the runner 21c and an unnecessary portion of the lead La are cut and removed. Then, the lead La is formed into a predetermined shape in a forming process.

In this way, the image sensor Dv, which includes a resin mold Ma having the window part Wd for exposing the light-receiving part Pt of the semiconductor chip Sc to the outside, is formed as shown in FIG. 8D. The image sensor Dv in FIG. 8D is a SOP (Small Outline Package) type, and its external appearance is shown in FIGS. 9A-9C. The above-described processes also may be used for a SOJ (Small Outline J-leaded) typed image sensors Dv and a DIP (Dual In-line Package) typed image sensors Dv, for example.

Figure 10A:
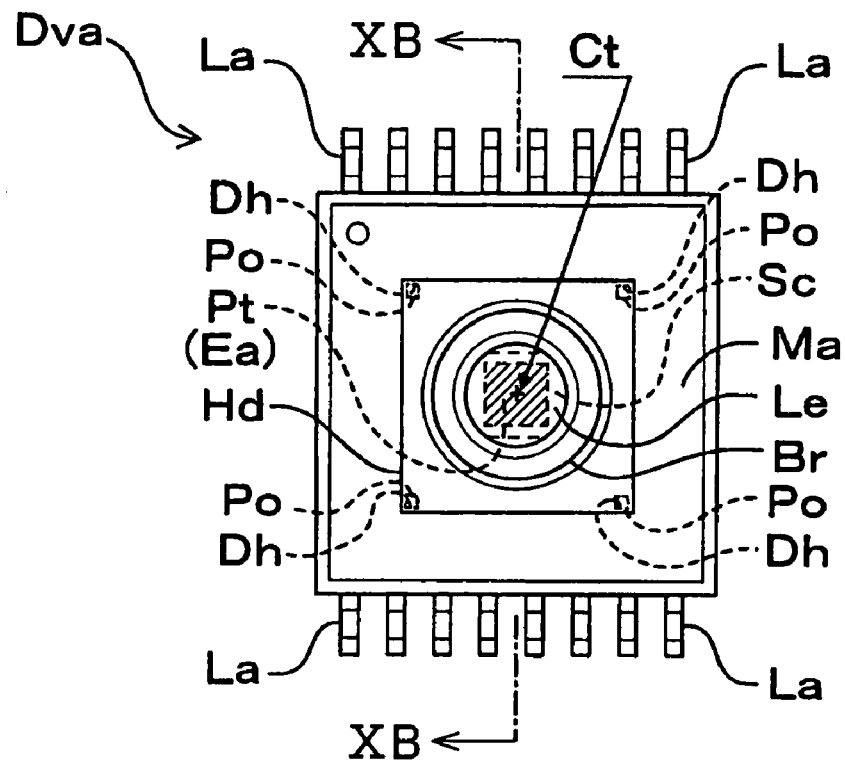
FIG. 10A is a plan view of an image sensor with a lens.
Figure 10B:
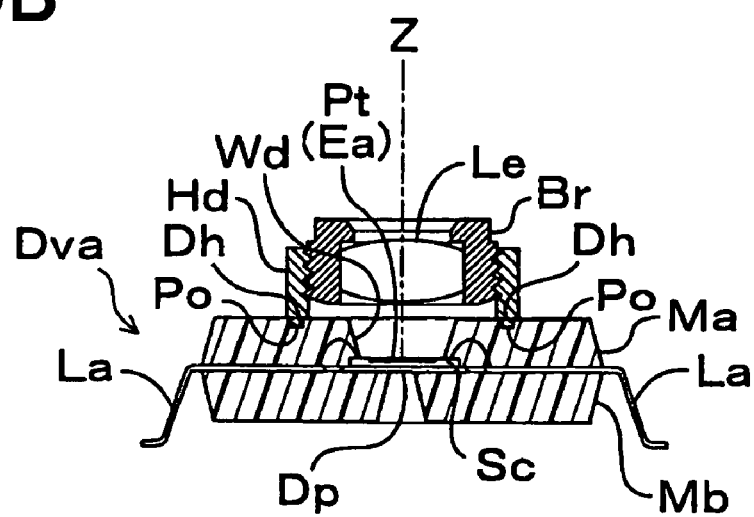
FIG. 10B is a cross-sectional view of the image sensor taken along line XB-XB in FIG. 10A.

In the image sensor Dva, the barrel Br for holding the lens Le is attached to the window part Wd of the resin mold Ma through the holder Hd. For forming the image sensor Dva, the projected parts 21d for forming the attaching slots Dh corresponding to each of the posts Po of the holder Hd are formed in the predetermined part in the upper cavity 21a of the upper mold 21. Herewith, in a process after the forming process, when the holder Hd is attached to the resin mold Ma, a positioning of the Hd, i.e., a positioning of the lens Le held by the barrel Br is easily and reliably performed. The positioning of the lens Le, for example, a positioning in which a Z axis of the lens Le is corresponded with a center Ct of the light-receiving part Pt as shown in FIGS. 10A and 10B is performed easily and reliably.

Figure 11A:
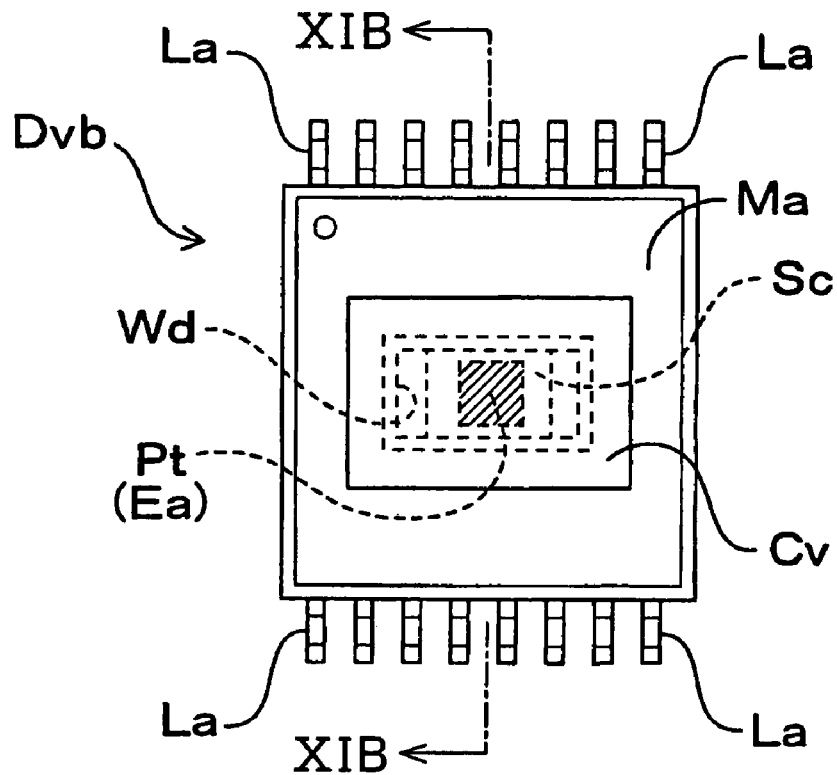
FIG. 11A is a plan view of an image sensor with a transparent cover.
Figure 11B:
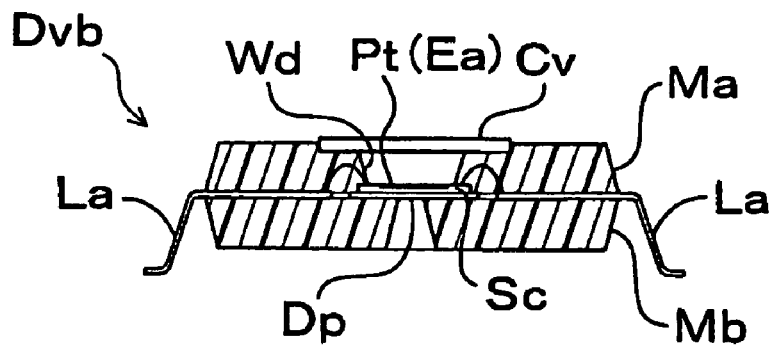
FIG. 11B is a cross-sectional view of the image sensor taken along line XIB-XIB in FIG. 11A.

In an image sensor Dvb in FIGS. 11A and 11B, the window part Wd of the resin mold Ma is covered with a transparent cover Cv. For forming the image sensor Dvb, in a process after the forming process, the transparent cover Cv is attached to the resin mold Ma with an adhesive and the like. The transparent cover Cv prevents a foreign material such as a dust from entering in the window part Wd from the outside and adhering to the light-receiving part Pt. Therefore, the light-receiving part Pt is prevented from the contamination.

As described above, in the molding apparatus 20 of the embodiment, when the resin material for forming the resin mold Ma is filled into the upper cavity 21a of the upper mold 21, the light-receiving part Pt of the semiconductor chip Sc is covered by the buffer sheet 28 provided between the convex part 21b and the semiconductor chip Sc.

Because the convex part 21b is separated from the light-receiving part Pt, the convex part 21b is prevented from contaminating the light-receiving part Pt. Therefore, the reliability of the semiconductor chip and the yield rate of the semiconductor chip Sc is improved. Thus, the reliability and the mass productivity of the semiconductor chip Sc packaged by resin molding are improved without increasing the accuracy of forming the upper mold 21 and the accuracy of the positioning of the lead frame Lf.

The delivering unit 31 deliveries the belt-shaped buffer sheet 28 on the semiconductor chip Sc, and the rewinding unit 32 rewinds the used buffer sheet 28u which passed on the semiconductor chip Sc. In this way, the buffer sheet 28 is carried automatically, and the used buffer sheet 28u is easily changed to the buffer sheet 28 before use. Therefore, the mass productivity is further improved.

Further, when the buffer sheet 28 is carried along the direction approximately perpendicular to the linearly-arranged direction (Xb) of the lead frames Lf, the buffer sheet 28 covers each of the light-receiving part Pt of the semiconductor chip Sc disposed on the die pad Dp of a portion of the lead frames Lf which passes between the upper mold 21 and the lower mold 23. Therefore, the buffer sheet 28 is not required to be positioned in the direction approximately perpendicular to the linearly-arranged direction (Xb) of the lead frames Lf. Therefore, the setting of the buffer sheet 28 is easy.

When the buffer sheet 28d or 28f is used, the buffer sheet 28d or 28f covers the whole surface of a portion of the lead frames Lf which passes between the upper mold 21 and the lower mold 23. Therefore, the buffer sheet 28d or 28f is not required to be positioned in both the linearly-arranged direction (Xb) of the lead frames Lf and the direction approximately perpendicular to the linearly-arranged direction (Xb) of the lead frames Lf. Therefore, the setting of the buffer sheet 28d or 28f is easy compared with a case where the positioning is required.

The convex surface 21b1 of the convex part 21b is formed into the rectangular shape so that the window part Wd becomes the rectangular shape. When the buffer sheet 28 is pressed by the convex part 21b to the semiconductor chip Sc, the wrinkle may be generated in the buffer sheet 28. However, when the convex surface 21b1 is the rectangular shape, the wrinkle can be escaped in the direction of the long side of the rectangular shape, and the wrinkle is reduced compared with a case where the convex surface 21b1 is a square shape. Therefore, defective molding of the window part Wd (e.g., burr and deformation) caused by the wrinkle is reduced. As a result, the mass productivity is improved.

The upper mold 21 has the plurality of the adsorbing holes 21h which are communication with the inner space 21s including upper cavity 21a. The adsorbing holes 21h are connected with the suction device 40. The buffer sheet 28 provided between the convex part 21b and the semiconductor chip Sc is adsorbed to the inner wall of the upper mold 21b y the suction device 40 through the adsorbing holes 21h, before the resin material is filled into the upper cavity 21a. Because the buffer sheet 28 is stuck along the inner wall, the defective molding of the resin mold Ma which may be caused by the buffer sheet 28 provided between the resin material and the inner wall is reduced. Therefore, the mass productivity is improved. Further, because the buffer sheet 28 is stuck to the inner wall due to the adsorbing of the suction device 40, the buffer sheet 28 is easily taken off from the inner wall by stopping the suction by the suction device 40. Therefore, the buffer sheet 28 is easily taken off from the upper mold 21 compared with when the buffer sheet 28 is stuck with an adhesive.

When the adsorbing holes 21h in the stepped parts IIIA and IIIB are more than in other parts, the adsorptive property is improved in the stepped parts IIIA and IIIB, in which the buffer sheet 28 is especially difficult to be stuck. Therefore, the buffer sheet 28 is stuck even in the stepped part IIIB corresponding to a surrounding of the convex part 21b, and the defective molding of the window part Wd of the resin mold Ma is reduced. As a result, the mass productivity is improved.

The lower mold 23 has the die mount 23b for supporting the die pad Dp of the lead flame Lf. Even if the die pad Dp is connected to the lead frame Lf with a flexible member, when the convex part 21b presses the die pad Dp, the die mount 23b supports the die pad Dp from an opposite side. Thus, the die mount 23b prevents the semiconductor chip Sc disposed on the die pad Dp from being pushed to a side of the lower cavity 23a of the lower mold 23. Therefore, the semiconductor chip Sc is packaged by resin molding appropriately, and the yield rate is improved. As a result, the mass productivity is improved.

Next, a modification of the above-described upper mold 21 of the mold apparatus 20 will be described with reference to FIGS. 12A and 12B. An upper mold 51 has a movable mold 53 corresponding to the convex part 21b of the upper mold 21. The movable mold 53 is provided for forming the window part Wd in the resin mold Ma. The movable mold 53 is movable separately from the upper mold 51, and closes to and leaves from the semiconductor chip Sc. Other parts of the upper mold 51 are similar to those of the upper mold 21.

Figure 12A:
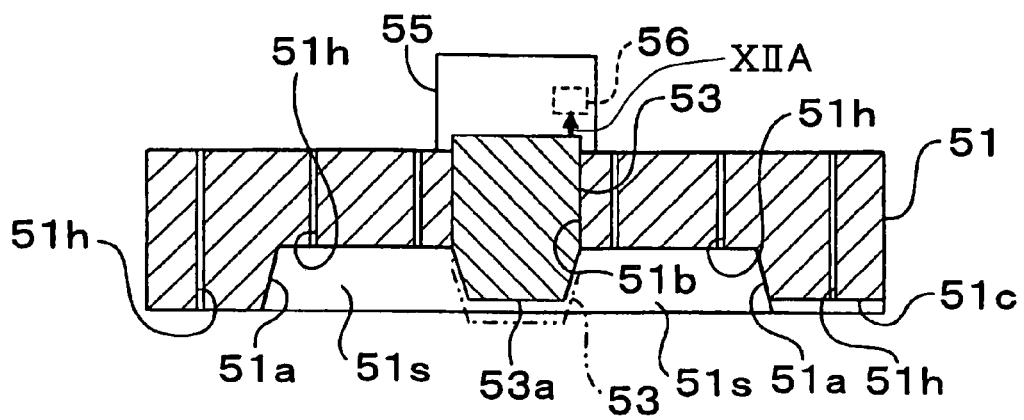
FIG. 12A is a cross-sectional view of an upper mold.
Figure 12B:
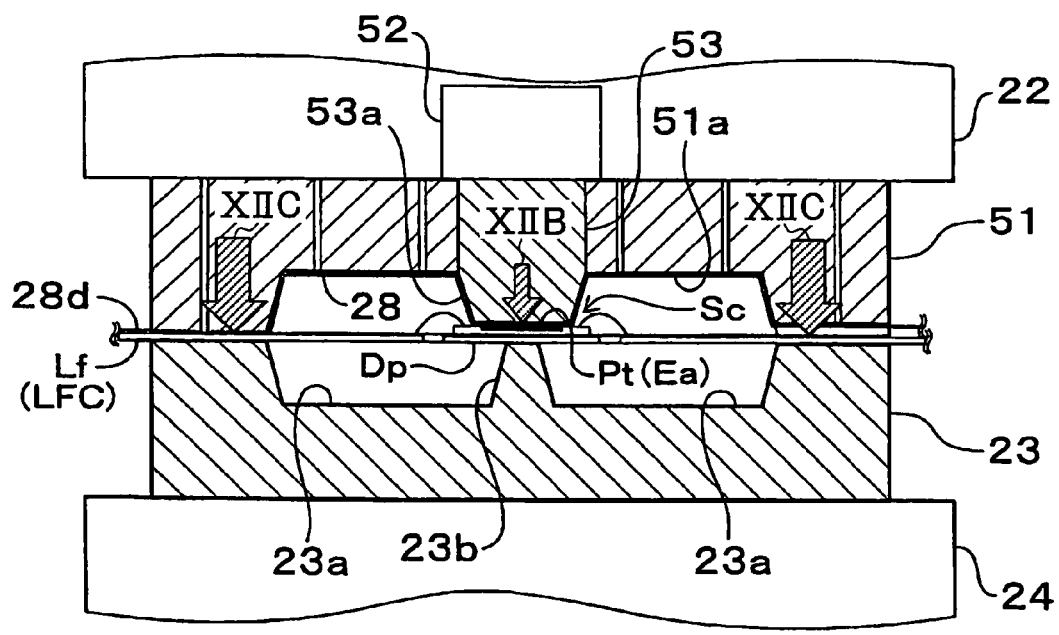
FIG. 12B is a cross-sectional view of a molding apparatus, according to a modification of the embodiment.

As shown in FIG. 12A, the upper mold 51 has an upper cavity 51a for providing an inner space 51s, and a sliding hole 51b formed in an approximately center portion of the upper cavity 51a so that the movable mold 53 is slidable therein up and down. The upper mold 51 further includes a runner 51c and the adsorbing holes 51h, similar to the upper mold 21.

The movable mold 53 is formed into a trapezoidal pillar shape, and has a convex part 53a at a pointed end thereof. The movable mold 53 is slidable in the sliding hole 51b in an axial direction. The movable mold 53 is pressed by a pressure device 55, which is provided apart from the pressure device 22 for pressing the upper mold 51. A pressure sensor 56 detects a pressure by the movable mold 53 as shown by an arrow XIIA, and feeds back a data of the pressure to the pressure device 55 so that the pressure device 55 controls the pressure to the movable mold 53.

The pressure of the movable mold 53 is controlled separately from the pressure of the upper mold 51. As shown in FIG. 12B, the movable mold 53 can be pressed with a lower pressure (small arrow XIIB) than the pressure (big arrows XIIC) of the upper mold 51. Therefore, when the light-receiving part Pt of the semiconductor chip Sc is damageable by pressing, the light-receiving part Pt is prevented from damaging by using the movable mold 53 as a mold holder. As a result, the mass productivity is improved.

Figure 13:
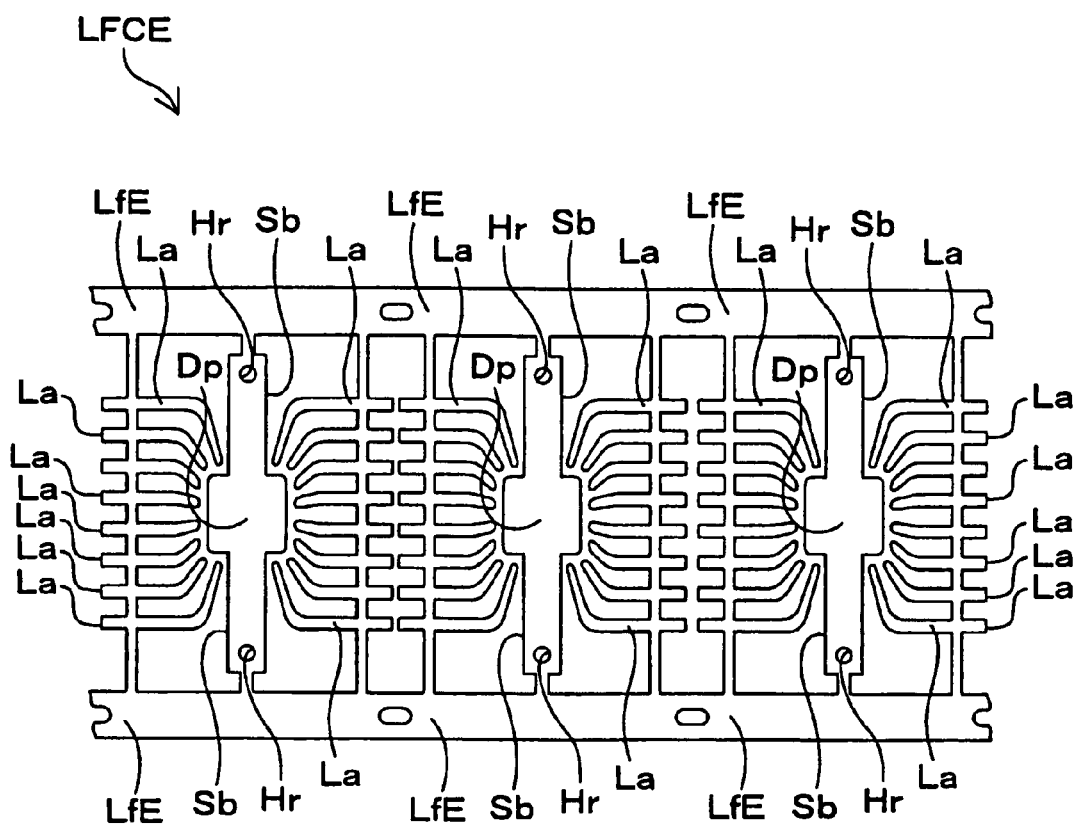
FIG. 13 is a plan view of a lead frame collectivity used for the image sensor with the lens.
Figure 14:
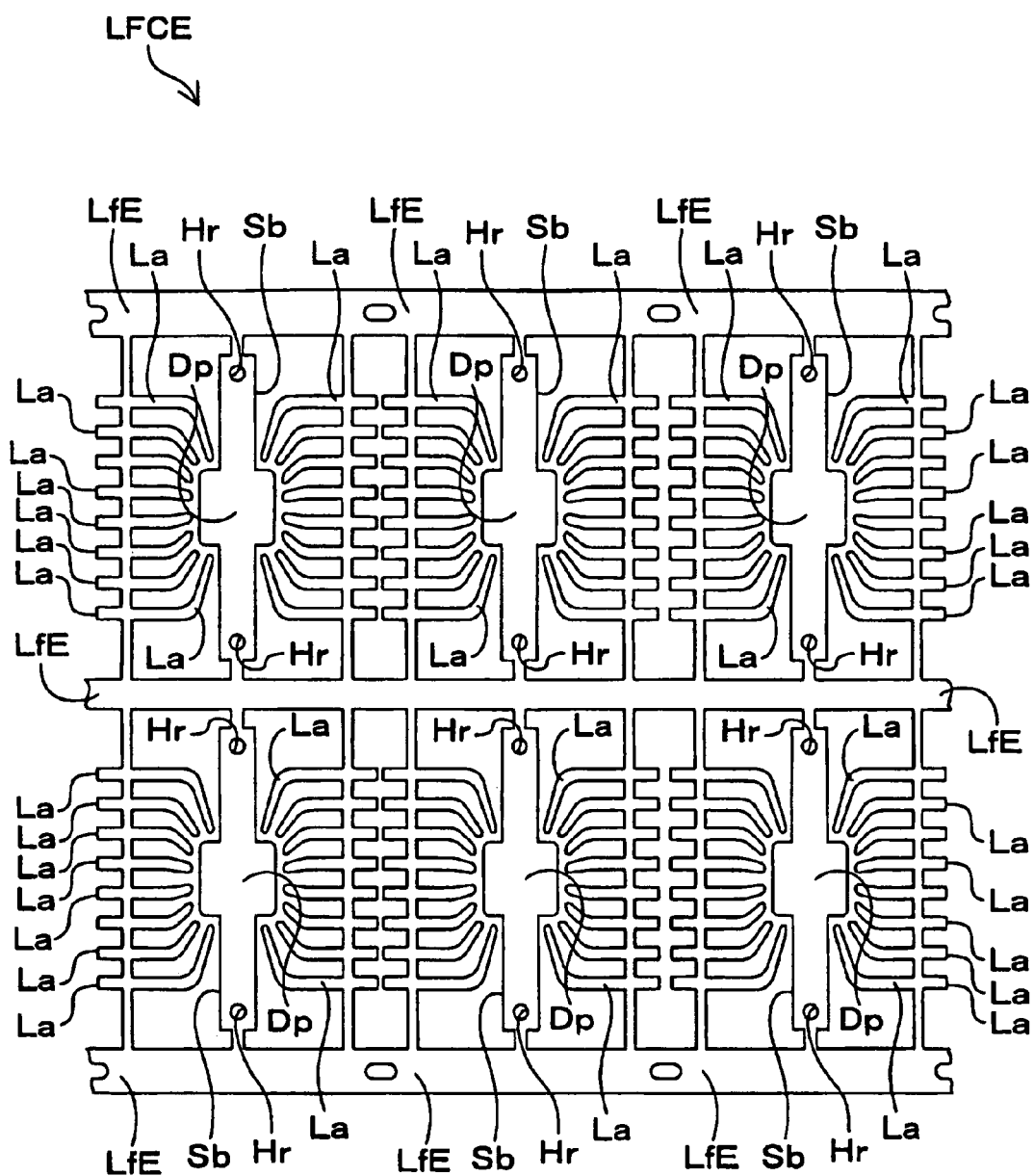
FIG. 14 is a plan view of a lead frame collectivity used for the image sensor with the lens.

As shown in FIGS. 13 and 14, lead frames LfE include supporters Sb having holes Hr. The parts of the lead frames LfE, which are substantially similar to those of the lead frames Lf in FIGS. 4A-6D, has same reference marks as those of lead frame Lf, and a description of the parts is abbreviated.

The lead frame LfE has the supporter Sb and a frame portion. The supporter Sb is connected to the frame portion of the lead frame at one end, and is connected to the die pad Db at another end. The die pad Db is supported by the frame portion through the supporter Sb. The hole Hr is formed in the supporter Sb to be exposed to the outside from the resin molds Ma and Mb formed by the molding apparatus 20.

The supporter Sb is longer and broader than those of the lead frames Lf in FIGS. 4A-4D. The hole Hr is formed on one end side (opposite end side to which the die pad Dp is connected) of the lead frame LfE. The portions, in which the hole Hr is formed, is set to be exposed to the outside from the resin molds Ma and Mb. For example the portion may be located outside of the lead La which is located at the most outside, and the portion is set to have a length and a width in which the hole Hr can be formed.

In FIG. 13, the lead frames LfE are arranged in a line to form a lead frame collectivity LFCE similarly to the lead frame collectivity LFC in FIG. 5A. In FIG. 14, the lead frames LfE are arranged in two lines to form the lead frame collectivity LFCE similarly to the lead frame collectivity LFC in FIG. 5B. However, the lead frame collectivity LFCE in FIG. 14 is substantially similar to the lead frame collectivity LFC in FIG. 13 except for a number of lines.

The above-described molding apparatus 20 processes the lead frame LfE under the lead frame setting process (FIG. 7A), the buffer sheet adsorbing process (FIG. 7B), the pressing process (FIG. 7C), the resin material injecting process (FIG. 8A), and the mold stripping process (FIG. 8B). Then, the packaged lead frame LfE is performs the diver cutting process (FIG. 8C) and the forming process. As a result, as shown in FIGS. 15A and 15B, the image sensor DvE, in which one end sides of the supporters Sb are exposed to the outside of the resin molds Ma and Mb, is formed.

Figure 15A:
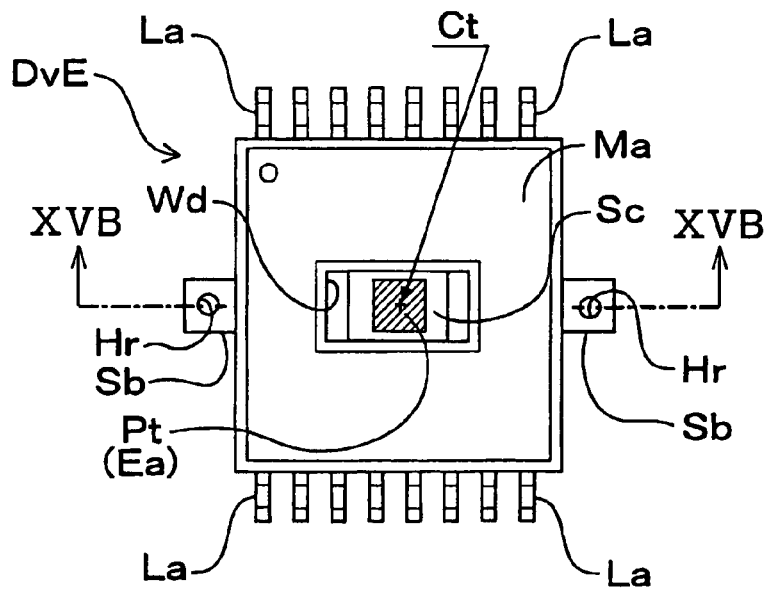
FIG. 15A is a plan view of the image sensor.
Figure 15B:
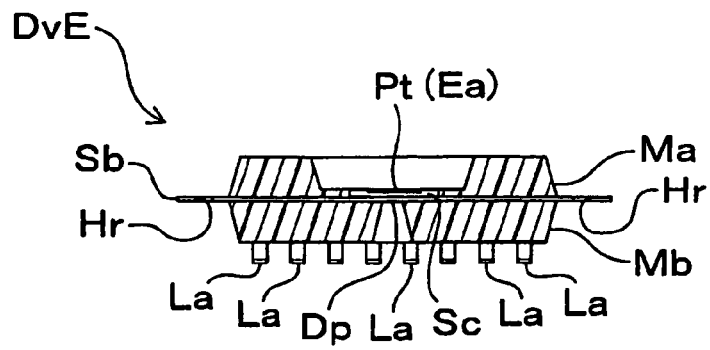
FIG. 15B is a cross-sectional view of the image sensor taken along line XVB-XVB in FIG. 15A, and the FIG. 15C is a cross sectional view of the image sensor with a holder.

The image sensor DvE in FIGS. 15A and 15B has the supporters Sb being broader and longer than those of the image sensor Dv in FIGS. 9A-9C. Because the supporter Sb in the image sensor DvE extends to a side of the frame portion, one end of the supporter Sb on the side of the frame portion protrudes to the outside of the resin molds Ma and Mb. In a protruding side of the supporter Sb, the hole Hr is formed to be exposed to the outside.

Figure 15C:
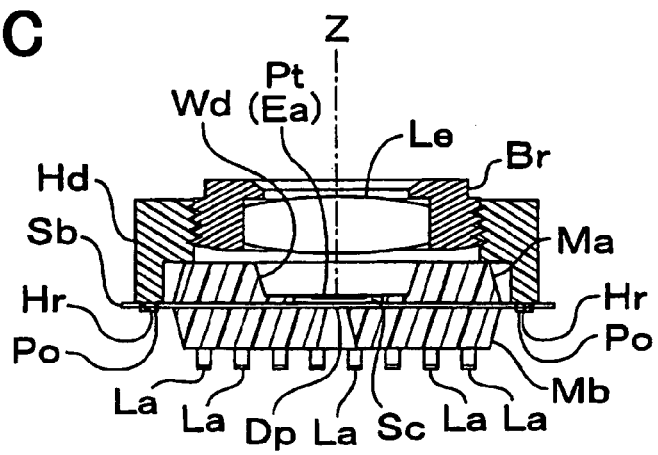

As shown in FIG. 15C, when the barrel Br for holding the lens Le is attached to the window part Wd of the resin mold Ma with the holder Hd, each of the posts Po of the holder Hd is positioned to each of the holes Hr, so that a Z axis of the lens Le corresponds with the center Ct of the light-receiving part Pt which is shown in FIG. 15A. In other words, when the holder Hd is attached to the image sensor DvE which is packaged with the resin molds Ma and Mb by the molding apparatus 20, the holder Hd is easily positioned by using the holes Hr as positioning holes. Therefore, an attaching speed of the holder Hd is improved.

Figure 16A:
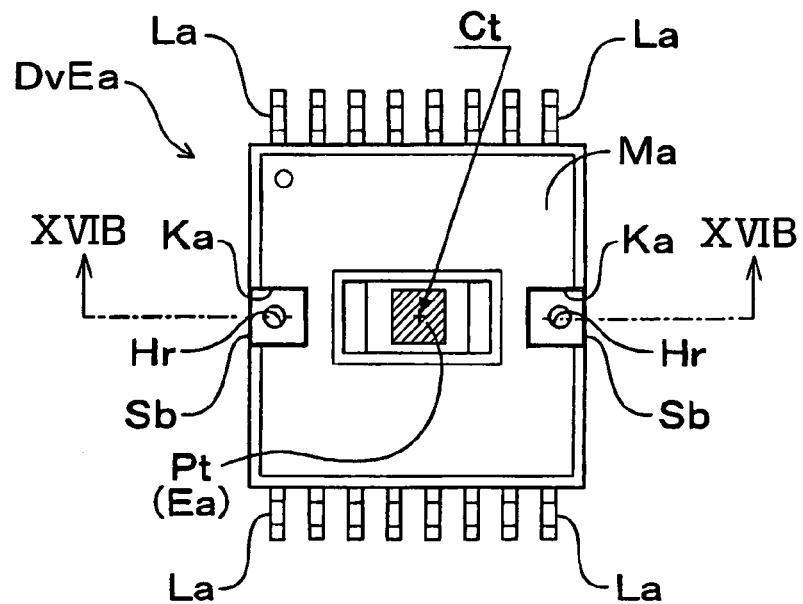
FIG. 16A is a plan view of the image sensor.
Figure 16B:
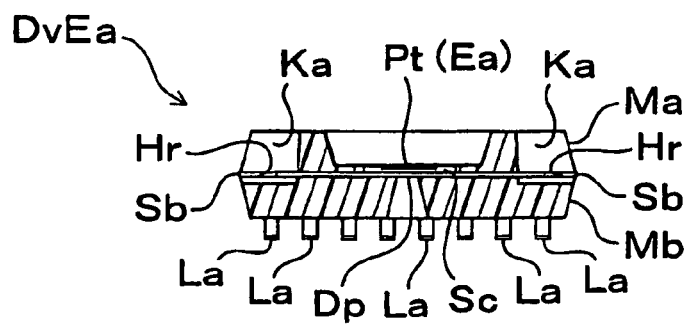
FIG. 16B is a cross-sectional view of the image sensor taken along line XVIB-XVIB in FIG. 16A, and the FIG. 16C is a cross sectional view of the image sensor with a holder.

Alternatively, an image sensor DvEa in FIGS. 16A and 16E has the supporters Sb which are shorter than those of the image sensor DvE in FIGS. 15A and 15B. However, the resin molds Ma and Mb have incision parts so that the hole Hr in the supporter Sb on the side of the frame portion is exposed to the outside of the resin molds Ma and Mb. The incision may be formed by convex parts (not shown) formed in the upper mold 21 and the lower mold 23.

Figure 16C:
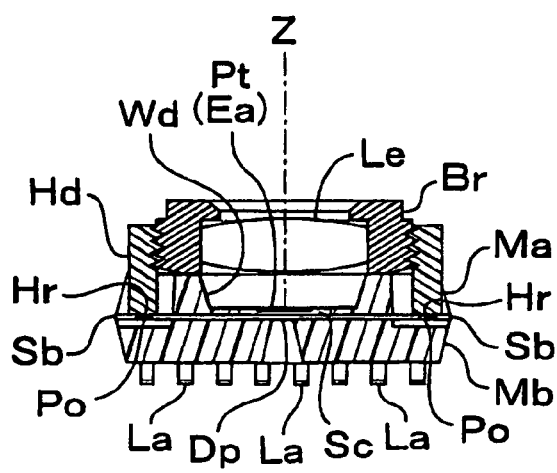

Herewith, as shown in FIG. 16C, in the image sensor DvEa, the hole Hr in the supporter Sb on the side of the frame portion is exposed to the outside. Therefore, the hole Hr functions as the positioning hole of the post Po of the holder Hd, so that a Z axis of the lens Le corresponds with the center Ct of the light-receiving part Pt which is shown in FIG. 16A. Thus, when the holder Hd is attached to the image sensor DvEa, the holder Hd is positioned easily and reliably. Therefore, the attaching speed of the holder Hd is improved.

Figure 17A:
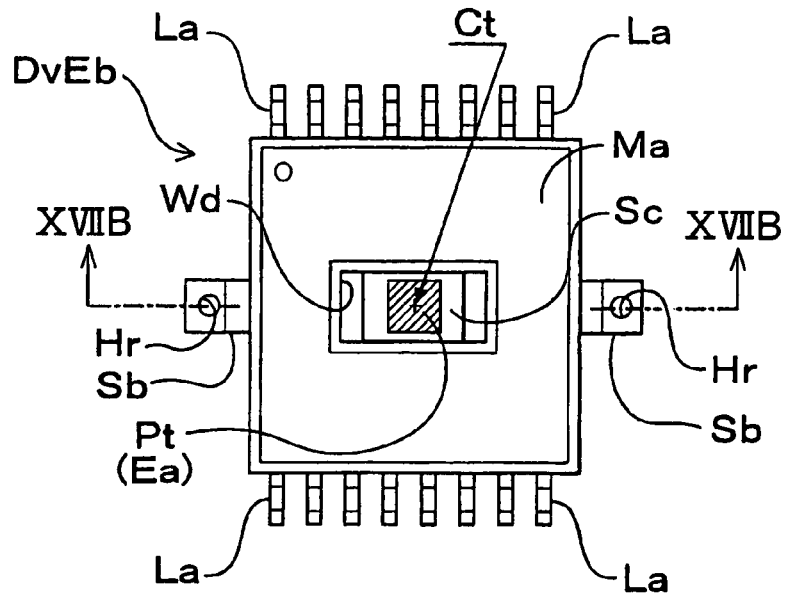
FIG. 17A is a plan view of the image sensor.
Figure 17B:
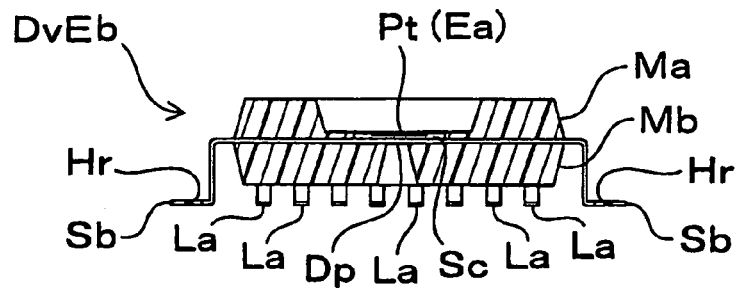
FIG. 17B is a cross-sectional view of the image sensor taken along line XVIIB-XVIIB in FIG. 17A, and the FIG. 17C is a cross sectional view of the image sensor with a holder.

Alternatively, an image sensor DvEb in FIG. 17A and FIG. 17B has the supporters Sb which are longer than those of the image sensor DvE in FIGS. 15A and 15B. In the image sensor DvEb, the supporter Sb is formed into L-shape, and the hole Hr is formed compactly in the supporter Sb on the side of the frame portion. The supporter Sb may be formed into the L-shape in the forming process of the leads La, similarly to the leads La.

Figure 17C:
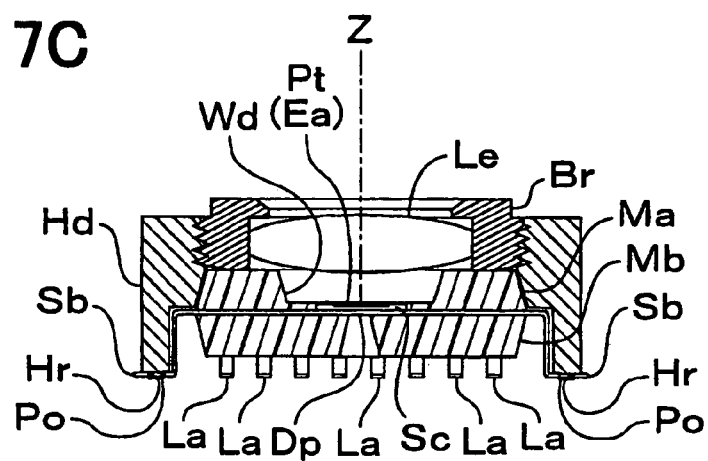

Herewith, as shown in FIG. 17C, in the image sensor DvEb, the hole Hr in the supporter Sb on the side of the frame portion is exposed to the outside. Therefore, the hole Hr functions as the positioning hole of the post Po of the holder Hd, so that a Z axis of the lens Le corresponds with the center Ct of the light-receiving part Pt which is shown in FIG. 17A, similarly to those in the image sensors DvE and DvEa. Thus, when the holder Hd is attached to the image sensor DvEb, the holder Hd is positioned easily and reliably. Therefore, the attaching speed of the holder Hd is improved.

Although the present invention has been fully described in connection with the preferred embodiments thereof with reference to the accompanying drawings, it is to be noted that various changes and modifications will become apparent to those skilled in the art.

What is claimed is:

1. An apparatus for manufacturing a semiconductor device, wherein the semiconductor device includes a semiconductor chip, a lead frame and a resin mold, wherein the semiconductor chip is disposed on a die pad of the lead frame, and wherein the semiconductor chip together with the lead frame is packaged with the resin mold in such a manner that an exposed area of the semiconductor chip is exposed to an outside of the resin mold, the apparatus comprising:
   a first mold having a first cavity for providing a shape of the resin mold on a first side of the semiconductor device, and a convex part for forming the exposed area of the semiconductor chip;
   a second mold having a second cavity for providing a shape of the resin mold on a second side of the semiconductor device;
   a buffer sheet which is disposed between the convex part and the semiconductor chip for covering the exposed area of the semiconductor chip in order to prevent a resin material of the resin mold from adhering to the exposed area;
   a pressure device configured to apply a first pressure to the convex part; and
   a pressure sensor; wherein:
   the convex part is an independent element so that the convex part is separately movable from an other part of the first mold;
   the convex part is configured to close to and leave from the semiconductor chip independently from the other part of the first mold based on the first pressure applied thereto by the pressure device;
   the pressure sensor detects a second pressure by the convex part and feed backs data of the second pressure to the pressure device; and
   the pressure device controls the first pressure based on the data of the second pressure received from the pressure sensor.

2. The apparatus for manufacturing the semiconductor device according to claim 1, wherein:
   the buffer sheet has a belt shape, and
   the apparatus further comprising:
   a delivering unit disposed on one end of the buffer sheet, for delivering the buffer sheet on the semiconductor chip; and
   a rewinding unit disposed on another end of the buffer sheet for rewinding the buffer sheet which has been delivered by the delivering unit and has passed on the semiconductor chip.

3. The apparatus for manufacturing the semiconductor device according to claim 2, wherein:
   the semiconductor chip includes a plurality of semiconductor elements;
   the lead frame includes a plurality of lead frame elements;
   each of the semiconductor elements is disposed on a die pad of the lead frame element;
   the lead frame elements are arranged linearly in a first direction;
   the delivering unit delivers the buffer sheet along the first direction; and
   the buffer sheet covers the exposed area of the semiconductor chip on the die pad which passes between the first mold and the second mold.

4. The apparatus for manufacturing the semiconductor device according to claim 2, wherein:
   the semiconductor chip includes a plurality of semiconductor elements;
   the lead frame includes a plurality of lead frame elements;
   each of the semiconductor elements is disposed on a die pad of the lead frame element;
   the lead frame elements are arranged linearly in a first direction;
   the delivering unit delivers the buffer sheet in a second direction which is approximately perpendicular to the first direction; and
   the buffer sheet covers the exposed area of the semiconductor chip on the die pad which passes between the first mold and the second mold.

5. The apparatus for manufacturing the semiconductor device according to claim 2, wherein:
   the semiconductor chip includes a plurality of semiconductor elements;
   the lead frame includes a plurality of lead frame elements;
   each of the semiconductor elements is disposed on a die pad of the lead frame element;
   the lead frame elements are arranged linearly in a first direction;
   the delivering unit delivers the buffer sheet so that the buffer sheet covers an entire surface of an area of the lead frame, in which the area passes between the first mold and the second mold.

6. The apparatus for manufacturing the semiconductor device according to claim 1, wherein:
   the buffer sheet has a belt shape; and
   the convex part has a shape for forming the exposed area into a rectangular shape.

7. The apparatus for manufacturing the semiconductor device according to claim 1, wherein:
   the first mold has a plurality of through communicating holes which are communicated between a first side and a second side of the first mold, and the first side faces the semiconductor device, and
   the apparatus further comprising:
   a suction device which sucks the buffer sheet disposed between the convex part and the semiconductor chip though the plurality of the trough communicating holes so that the buffer sheet adsorbs to the first side of the first mold including a wall of the first cavity.

8. The apparatus for manufacturing the semiconductor device according to claim 7, wherein:
the first mold includes a stepped part and other parts;
the stepped part is disposed around a boundary between the convex part and the first cavity;
the through communicating holes in the stepped part are more than in the other parts.

9. The apparatus for manufacturing the semiconductor device according to claim 1, wherein:
the second mold has a holding convex part for holding the die pad of the lead frame.

10. An apparatus for manufacturing a semiconductor device, wherein the semiconductor device includes a semiconductor chip, a lead frame and a resin mold, wherein the semiconductor chip is disposed on a die pad of the lead frame, and wherein the semiconductor chip together with the lead frame is packaged with the resin mold in such a manner that an exposed area of the semiconductor chip is exposed to an outside of the resin mold, the apparatus comprising:
a first mold having a first cavity for providing a shape of the resin mold on a first side of the semiconductor device, and a convex part for forming the exposed area of the semiconductor chip;
a second mold having a second cavity for providing a shape of the resin mold on a second side of the semiconductor device;
a buffer sheet which is disposed between the convex part and the semiconductor chip for covering the exposed area of the semiconductor chip in order to prevent a resin material of the resin mold from adhering to the exposed area;
a delivering unit disposed on one end of the buffer sheet, for delivering the buffer sheet on the semiconductor chip; and
a rewinding unit disposed on another end of the buffer sheet for rewinding the buffer sheet which has been delivered by the delivering unit and has passed on the semiconductor chip, wherein:
the buffer sheet has a belt shape;
the semiconductor chip includes a plurality of semiconductor elements;
the lead frame includes a plurality of lead frame elements;
each of the semiconductor elements is disposed on a die pad of one of the lead frame elements;
the lead frame elements are arranged linearly in a first direction;
the delivering unit delivers the buffer sheet in a second direction which is approximately perpendicular to the first direction; and
the buffer sheet covers the exposed area of the semiconductor chip on the die pad which passes between the first mold and the second mold.

11. An apparatus for manufacturing a semiconductor device, wherein the semiconductor device includes a semiconductor chip, a lead frame and a resin mold, wherein the semiconductor chip is disposed on a die pad of the lead frame, and wherein the semiconductor chip together with the lead frame is packaged with the resin mold in such a manner that an exposed area of the semiconductor chip is exposed to an outside of the resin mold, the apparatus comprising:
a first mold having a first cavity for providing a shape of the resin mold on a first side of the semiconductor device, and a convex part for forming the exposed area of the semiconductor chip, the first mold having a plurality of through communicating holes which are communicated between a first side and a second side of the first mold, the first side of the first mold facing the semiconductor device;
a second mold having a second cavity for providing a shape of the resin mold on a second side of the semiconductor device;
a buffer sheet which is disposed between the convex part and the semiconductor chip for covering the exposed area of the semiconductor chip in order to prevent a resin material of the resin mold from adhering to the exposed area; and
a suction device which sucks the buffer sheet disposed between the convex part and the semiconductor chip though the plurality of the trough communicating holes so that the buffer sheet adsorbs to the first side of the first mold including a wall of the first cavity, wherein:
the first mold includes a stepped part and other parts;
the stepped part is disposed around a boundary between the convex part and the first cavity; and
the through communicating holes in the stepped part are more than in the other parts.

\* \* \* \* \*